United States Patent [19]

Mackenthun

[11] Patent Number: 5,450,578

[45] Date of Patent: Sep. 12, 1995

[54] METHOD AND APPARATUS FOR AUTOMATICALLY ROUTING AROUND FAULTS WITHIN AN INTERCONNECT SYSTEM

[75] Inventor: Donald W. Mackenthun, Fridley, Minn.

[73] Assignee: Unisys Corporation, Blue Bell, Pa.

[21] Appl. No.: 172,647

[22] Filed: Dec. 23, 1993

[51] Int. Cl.⁶ .................................................. G06F 11/00
[52] U.S. Cl. ................................... 395/182.02; 379/221
[58] Field of Search .................... 371/32, 30, 33, 11.2, 371/11.1, 7, 8.1, 8.2; 379/219, 220, 221; 395/575

[56] References Cited

U.S. PATENT DOCUMENTS

| | | | |
|---|---|---|---|
| 4,074,072 | 2/1978 | Christensen et al. | 179/15 |
| 4,345,116 | 8/1982 | Ash et al. | |
| 4,365,294 | 12/1982 | Stokken | 364/200 |
| 4,480,330 | 10/1984 | Magnusson et al. | 370/110.2 |
| 4,491,945 | 1/1985 | Turner | 370/60 |
| 4,494,230 | 1/1985 | Turner | 370/60 |
| 4,551,814 | 11/1985 | Moore et al. | 364/716 |
| 4,551,815 | 11/1985 | Moore et al. | 364/716 |
| 4,556,939 | 12/1985 | Read | 364/200 |
| 4,562,533 | 12/1985 | Hodel et al. | 364/200 |
| 4,621,339 | 11/1986 | Wagner et al. | 364/900 |
| 4,625,081 | 11/1986 | Lotito et al. | 379/88 |
| 4,649,384 | 3/1987 | Sheafor et al. | 340/825.03 |
| 4,679,186 | 7/1987 | Lea | 370/14 |
| 4,696,000 | 9/1987 | Payne, III | 370/60 |
| 4,794,594 | 12/1988 | Picard | 370/94 |
| 4,831,518 | 5/1989 | Yu et al. | 364/200 |
| 4,864,558 | 9/1989 | Imagawa et al. | 370/60 |
| 4,872,159 | 10/1989 | Hemmady et al. | 370/60 |
| 4,891,751 | 1/1990 | Call et al. | 364/200 |
| 4,899,333 | 2/1990 | Roediger | 370/60 |
| 4,899,335 | 2/1990 | Johnson, Jr. et al. | 370/60 |
| 4,991,204 | 2/1991 | Yamamoto et al. | 379/221 |
| 5,005,167 | 4/1991 | Arthurs et al. | 370/4 |
| 5,038,343 | 8/1991 | Lebizay et al. | 370/60 |
| 5,041,971 | 8/1991 | Carvey et al. | 364/200 |
| 5,051,742 | 9/1991 | Hullett et al. | 340/825.5 |
| 5,068,892 | 11/1991 | Livanos | 379/221 |
| 5,101,204 | 3/1992 | Ash et al. | 379/221 |
| 5,130,982 | 7/1992 | Ash et al. | 370/85.7 |
| 5,161,156 | 11/1992 | Baum et al. | 371/7 |
| 5,163,087 | 11/1992 | Kaplan | 379/94 |
| 5,163,131 | 11/1992 | Row et al. | 395/200 |
| 5,237,566 | 8/1993 | Brand et al. | 370/61 |
| 5,245,616 | 9/1993 | Olson | 371/32 |
| 5,283,783 | 2/1994 | Nguyen et al. | 370/16.1 |
| 5,307,481 | 4/1994 | Shimazaki et al. | 395/575 |
| 5,361,249 | 11/1994 | Monastra et al. | 370/16 |
| 5,361,250 | 11/1994 | Nguyen et al. | 370/16.1 |

Primary Examiner—Robert W. Beausoliel, Jr.
Assistant Examiner—Albert Decady
Attorney, Agent, or Firm—Nawrocki, Rooney & Sivertson

[57] ABSTRACT

A computer architecture for providing enhanced reliability while mitigating the high costs of total redundancy. The HUB and Street architecture couples a plurality of commonly shared busses called streets with a plurality of smart switching elements called HUBs. The streets are busses for transferring data between HUB elements. The HUB elements are capable of directing data across the street structures and deliver said data to a desired destination. The system designer can either increase or decrease the number of HUB elements and streets to either increase or decrease the reliability and cost of the particular computer system. In addition, the HUB elements have a built in priority scheme for allowing high priority data to be transferred before low priority data. Finally, the HUB elements have the capability of automatically detecting faults within the system and can redirect the data around said faults. This automatic rerouting capability is the subject of the present invention.

6 Claims, 22 Drawing Sheets

OUTPUT PRIORITY

| | | Up Street | Down Street | IXP | HIA | Internal |
|---|---|---|---|---|---|---|
| HUB 0 | 1.<br>2.<br>3.<br>4. | UP<br>IXP<br>HIA<br>Int. | DWN<br>IXP<br>HIA<br>Int. | UP<br>DWN<br>HIA<br>Int. | UP<br>DWN<br>IXP<br>Int. | UP<br>DWN<br>IXP<br>HIA |
| HUB 1 | 1.<br>2.<br>3.<br>4. | UP<br>NVS<br>Int.<br>XOVR | DWN<br>NVS<br>Int.<br>XOVR | UP<br>DWN<br>Int.<br>XOVR | UP<br>DWN<br>NVS<br>XOVR | UP<br>DWN<br>NVS<br>Int. |

FIG. 9

| 0 | 1 | 2 | 3 | 4 - 7 | 8 - 11 | 12 - 15 |
|---|---|---|---|---|---|---|
| S | R | C0 | C1 | NOT USED | UID | BPID |

S = Street Flag
R = Release Flag
C = Crossover Flags
UID = Unit Identification
   8,9 = Unit Type
   10,11 = Unit, Set or SIF Location
BPID = Backpanel Identification

FIG. 10

UID VALUES

| UID | UNIT |
|---|---|
| 0 | HIA 0 |
| 1 | HIA 1 |
| 2 | HIA 2 |
| 3 | HIA 3 |
| 4 | IXP/RLP/SSF 0 |
| 5 | IXP/RLP/SSF 1 |
| 6 | IXP/RLP/SSF 2 |
| 7 | IXP/RLP/SSF 3 |
| 8 | not used |
| 9 | not used |
| 10 | not used |
| 11 | not used |
| 12 | NVS Norma |
| 13 | NVS Diagnostic |
| 14 | NVS A |
| 15 | NVS B |

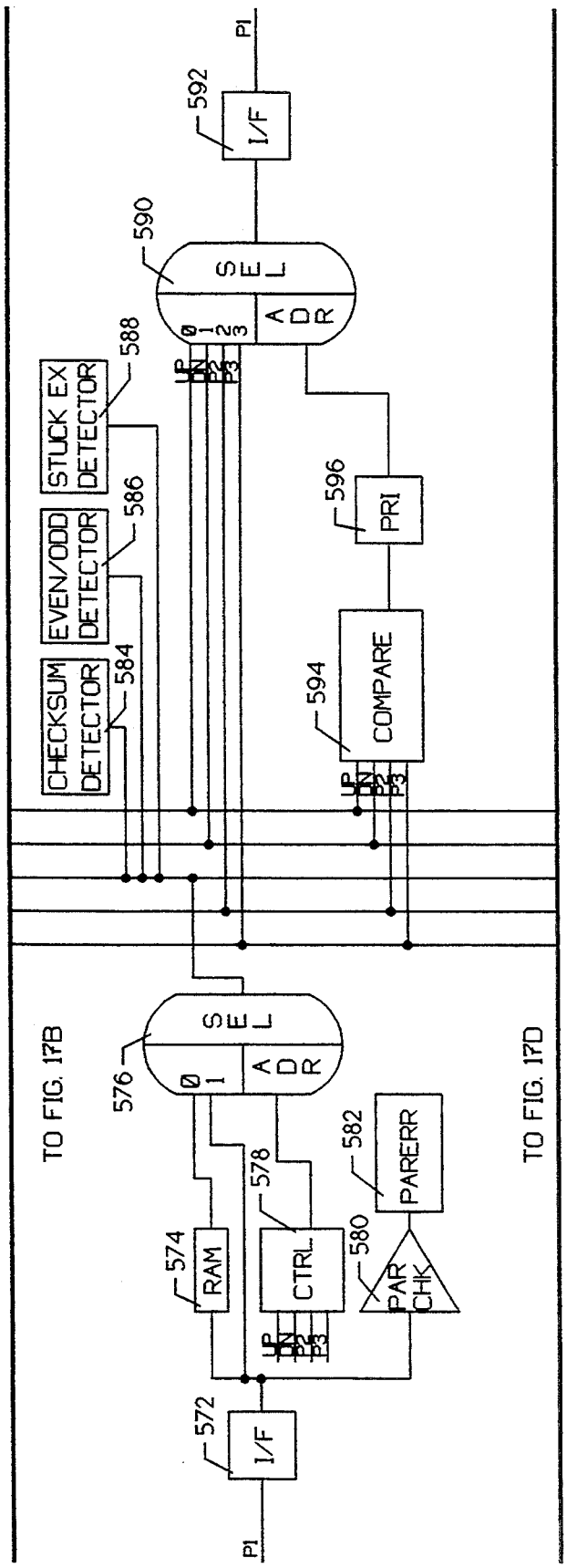

METHOD AND APPARATUS FOR AUTOMATICALLY ROUTING AROUND FAULTS WITHIN AN INTERCONNECT SYSTEM

CROSS REFERENCE TO CO-PENDING APPLICATIONS

This invention is related to commonly assigned U.S. Pat. application Ser. No. 08/173,429, filed Dec. 23, 1993, and entitled "Hub and Street Architecture", which is expressly incorporated herein by reference.

BACKGROUND OF THE INVENTION

1. Field of the Invention

The present invention is generally related to general purpose, stored program, digital computers and more particularly relates to efficient architectures having a capability to automatically reconfigure in the event a fault is detected to improve reliability.

2. Description of the Prior Art

A key element in the design of digital data processing equipment is the factor of reliability. One technique for the enhancement of reliability is the use of internally redundant components. U.S. Pat. Nos. 4,551,814 and 4,551,815, issued to Moore et al. describe an approach to internally redundant individual logic elements. This technique is extremely costly, however. Furthermore, reliability at the system level must ultimately be addressed as a system design problem, because system reliability concerns more than just the sum of the reliability of the components.

One field in which substantial effort has been expended towards system level reliability is in telephone switching networks. U.S. Pat. No. 4,625,081, issued to Lotito et al. describes a large scale modern telephone switching network. A non-blocking packet switching network having some capability to automatically switch into non-blocking configurations is discussed in U.S. Pat. No. 4,696,000, issued to Payne, III. A method and apparatus for rerouting of telephone data for the improvement of reliability is suggested in U.S. Pat. No. 4,649,384, issued to Sheafor et al.

U.S. Pat. No. 4,074,072, issued to Christiansen et al., shows a switching network which operates under multiprocessor control. Fast packet switching is discussed in U.S. Pat. Nos. 4,491,945 and 4,494,230, both issued to Turner. Alternative packet switching systems are shown in U.S. Pat. No. 4,872,159, issued to Hemmady et al. and U.S. Pat. No. 4,679,186, issued to Lea. A measure of improved reliability is provided by redundant resources in the Lea approach.

Digital tone distribution is provided by the network of U.S. Pat. No. 4,480,330, issued to Magnusson et al., whereas U.S. Pat. No. 5,163,087, issued to Kaplan shows a network which converts an automatic number identification into a customer data base key.

An architecture for a high speed packet switching network is discussed in U.S. Pat. No. 4,899,333, issued to Roediger. An alternative high speed routing approach is shown in U.S. Pat. No. 5,038,343, issued to Lebizay et al. Yet another approach to self-routing is seen in U.S. Pat. No. 4,864,558, issued to Imagawa et al. U.S. Pat. No. 5,161,156, issued to Baum et al. provides an approach to a high speed packet switching network having an error correction and recovery capability. An optical network is shown in U.S. Pat. No. 5,005,167, issued to Arthurs et al. A self-routing packet switching network is discussed in U.S. Pat. No. 4,899,335, issued to Johnson, Jr. et al. U.S. Pat. No. 5,130,982, issued to Ash et al., provides a fully shared communications network.

The problems associated with data transmission within a data processing system tend to be exacerbated by the higher speeds involved. A common architectural approach uses a common shared bus for the transmission of digital data to control the cost of the transmitting and receiving resources. U.S. Pat. No. 5,051,742, issued to Hullett et al., describes a queuing protocol for a system employing a bussed architecture. U.S. Pat. No. 4,794,594, issued to Picard, uses a common bus for transfer of data blocks within a communications network. A modularized approach to communication within a bussed architecture is found in U.S. Pat. No. 4,365,294, issued to Stokken. U.S. Pat. No. 5,163,131, issued to Row et al., provides a file server architecture using a common shared bus.

The vector processor of U.S. Pat. No. 4,621,339, issued to Wagner et al., provides parallel processing through the use of a single instruction-multiple data (SIMD) architecture. A similar vector processing architecture is seen in U.S. Pat. No. 4,891,751, issued to Call et al.

The use of bussed architectures, while efficiently employing the interconnect elements, presents reliability problems, since the bus is a shared component subject to preventing any and all intra-system communication upon failure. One approach to improving reliability within a bussed architecture involves taking particular precautions with those circuits which directly interact with the bus. U.S. Pat. No. 4,556,939, issued to Read, provides interface circuits which are called highways to couple with the bus. A measure of added bus reliability is thus obtained through the use of redundancy within the highway interfaces.

An alternative approach to the reliability problem is through the use of point-to-point rather than bussed architectures. These tend to be quite costly because of the greater amount of hardware required. As a result, such techniques are primarily employed for input/output transfers wherein the added hardware may be required anyway because of the physical separation of the communicating elements. U.S. Pat. No. 4,562,533, issued to Hodel et al., shows such an input/output transmission system.

An intermediate alternative between the totally shared common bus and the point-to-point approach may be seen in U.S. Pat. No. 5,041,971, issued to Carvey et al., which routes the data using switching elements, through which a transmission path may be selected. Reliability is improved because multiple independent paths may be configured for transmission of data between any two system elements. To ensure that the switching system is non-blocking, enough paths are provided to permit simultaneous communication between any and all combinations of system elements. In part to mitigate the extreme cost of this approach, only synchronous serial transmissions are provided. This greatly decreases the effective bandpass in comparison to systems employing wide word (i.e. 32 or more bits) parallel transfers for intra-system data transmissions.

SUMMARY OF THE INVENTION

The present invention overcomes the disadvantages found in the prior art by providing a method for automatically detecting faults within a computer architecture and then rerouting data around the faults while still ensuring that the data arrives at the desired destination. This capability substantially increases the reliability of computer systems because the operation of the computer systems will continue error free even in the event of multiple internal hardware failures.

The preferred mode of the present invention is used in the computer architecture described in the above referenced co-pending commonly assigned U.S. Ser. No. 08/173,429, incorporated herein by reference. The referenced application teaches the use of a series of shared busses (called streets) coupled to a series of smart switching elements (called HUBs). The HUBs are capable of directing data across the streets to a desired destination. In addition, the HUBs also provide a means for prioritizing bus requests to ensure that the highest priority data gets transferred first.

The HUB and street architecture (as described in the referenced co-pending Application) is a network of interconnected HUB elements that allows one set of HUB elements to transmit and receive data either directly or through another set of HUB elements. In the preferred embodiment, the HUB elements are grouped into pairs with a HUB0 and a HUB1. Each HUB0 and HUB1 pair are horizontally connected together and each HUB1 is horizontally connected to a supporting device such as a memory element. The HUB0 elements are connected to an Index Processor (IXP) and a Host Interface Adapter (HIA) processing elements which initiate the transmission of data and requests for the transmission of data to and from the memory element.

The HUB0 elements are vertically connected to adjacent HUB0 elements through requester streets (both UP and DOWN streets). Similarly, the HUB1 elements are vertically connected to adjacent HUB1 elements through responder streets. The streets are busses (i.e. one UP street and one DOWN street) which can be accessed by any HUB element connected thereto and each HUB element can transmit data either UP or DOWN the appropriate street. Each street can only be accessed by one HUB element at a time and therefore each HUB element has a built in priority scheme which enables high priority data to be transferred first.

The preferred mode of the present invention is integrated into the HUB and Street architecture. An AVAILABLE line is connected between any two HUB elements. If for example, a first HUB element wants to send a request to a second HUB element via a first street element, then the AVAILABLE line from the second HUB element to the first HUB element must be active indicating that the second HUB element is ready to receive the request. If the AVAILABLE line is inactive, then the first HUB element does not send a request to the second HUB element but rather reroutes the request along a different path within the HUB and street architecture to the desired destination.

The HUB elements can also detect when a second HUB element is not functioning properly. The first HUB element sets a timer upon sending a request to a second HUB element. If an acknowledge is not received from said second HUB element before the timer expires, the first HUB element will start redirecting packets through alternative paths. In the preferred mode, the HUB elements can detect up to eleven different faults.

The description given herein does not limit the scope of the present invention to a HUB and Street architecture. The reliability of any computer architecture containing redundant paths would benefit from the advances discussed herein.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 9 is a table containing the output priority scheme for the HUB0 and the HUB1 elements;

FIG. 10 is a diagram defining the HUB control format;

FIG. 11 is a diagram defining the Unit Identification field;

FIG. 17 is a high level functional block diagram of a HUB element.

FIG. 17C is a third functional block diagram showing a third portion of the HUB element as shown in FIG. 17.

DETAILED DESCRIPTION OF THE PREFERRED EMBODIMENT

Figure 1:
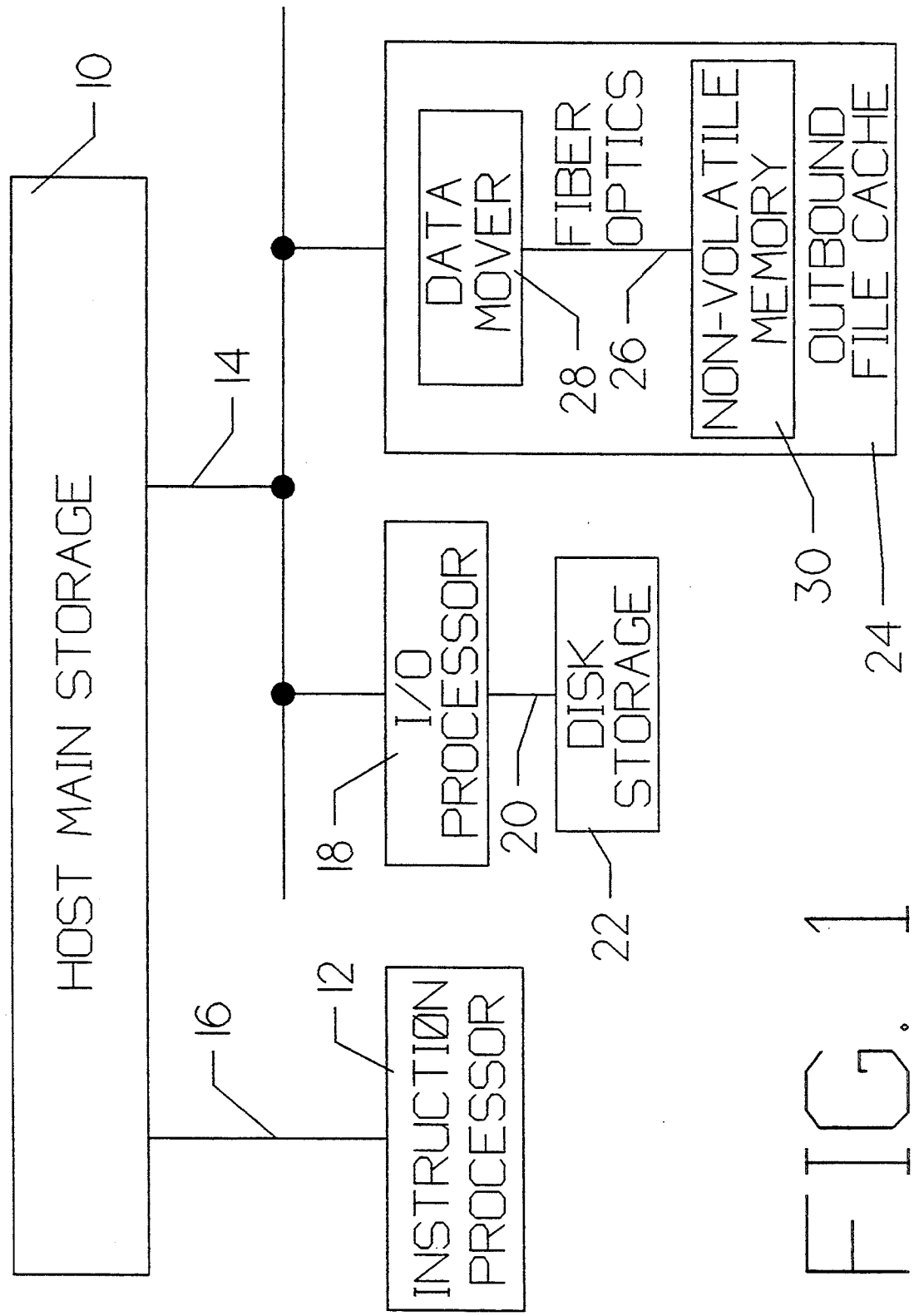
FIG. 1 is a block diagram of the Extended Processor Complex (XPC)

FIG. 1 is a block diagram of the extended processor complex (XPC). The XPC comprises an instruction processor 12, IO processor 18, disk storage 22, Outbound File Cache 24, and host main storage 10. Instruction processor 12 receives instructions from host main storage 10 via wire 16. Host main storage 10 is also coupled to MBUS 14. I/O processor 18 is coupled to MBUS 14 and is further coupled to disk storage 22 via wire 20. The Outbound File Cache block 24, which is the primary focus of the preferred mode of this invention, is also coupled to MBUS 14. Outbound File Cache block 24 comprises a data mover 28 and nonvolatile memory 30. Data mover 28 is coupled to nonvolatile memory 30 via fiber-optic cable 26. The data is transferred from the disk storage 22 through I/O processor 18 to the host main storage 10. But now, any updates that occur in the data are stored in the Outbound File Cache 24 nonvolatile memory 30 instead of disk storage 22, at least momentarily. All future references then access the data in the nonvolatile memory 30. Therefore the nonvolatile memory 30 acts like a cache for the disk and significantly increases data access speeds. Only after this data is no longer being used by the system is it transferred back to disk storage 22. In the Outbound File Cache, data mover 28 connected to MBUS 14 is used to transmit data from the host main storage 10 to the nonvolatile memory 30 and vice versa. Only one data mover 28 is illustrated in FIG. 1.

Figure 2:
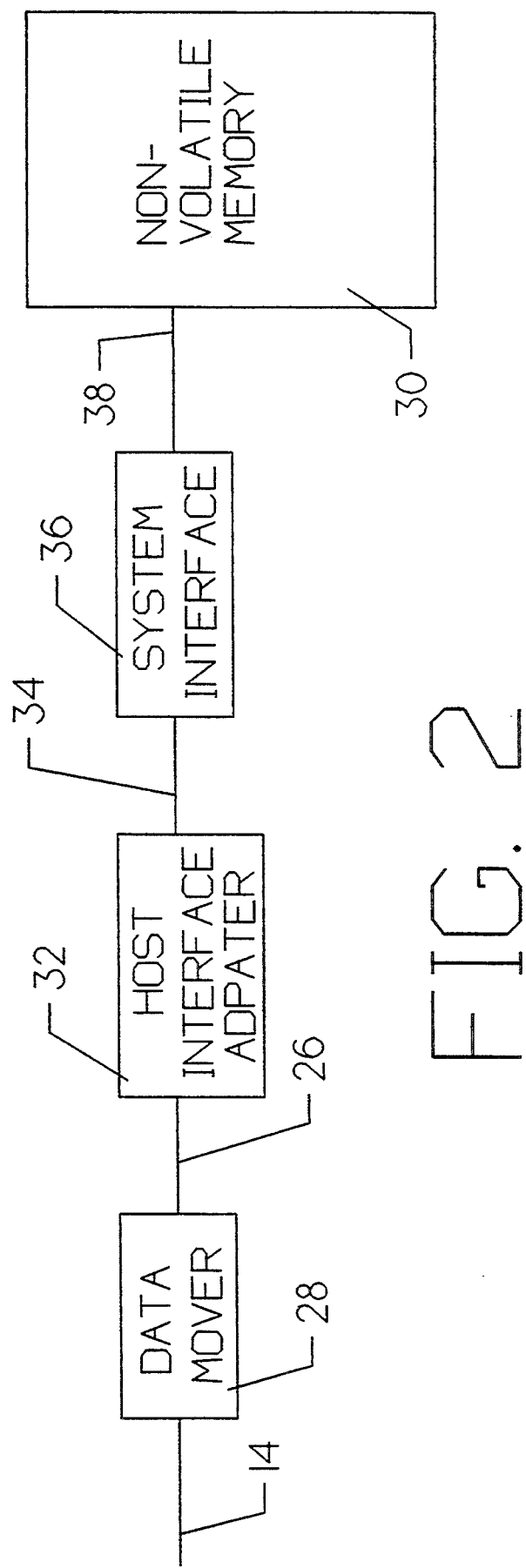
FIG. 2 is a block diagram of the Outbound File Cache Block.

FIG. 2 is a block diagram of the Outbound File Cache block 24 (see FIG. 1). Within the Outbound File Cache block 24, additional components are required to interface with the nonvolatile memory. These include host interface adaptor 32 and a system interface 36. Data mover 28 is coupled to MBUS 14 and further coupled to host interface adaptor 32 via fiber-optic interface 26. System interface 36 is coupled to host interface adaptor 32 via wire 34 and further coupled to nonvolatile memory 30 via wire 38. For every data mover 28 there is a host interface adaptor 32 and system interface 36 which is added to the system. As more and more data movers 28 are added to the system, it becomes apparent that a bottle neck could occur in requests to the nonvolatile memory 30. As a result, the size of the nonvolatile memory 30 and the necessary bandwidth which is required to access this memory becomes a major performance concern. The present invention alleviates this problem by allowing a plurality of nonvolatile memory elements to be connected in parallel and further allowing access to every nonvolatile memory element from every input port.

On each system interface card 36 a processor called an index processor (IXP) is used to manage the caching function (just one of the IXP's functions). So the index processor (see FIG. 5, IXP1 192 for an example) also has a path to nonvolatile memory 30.

Figure 3:
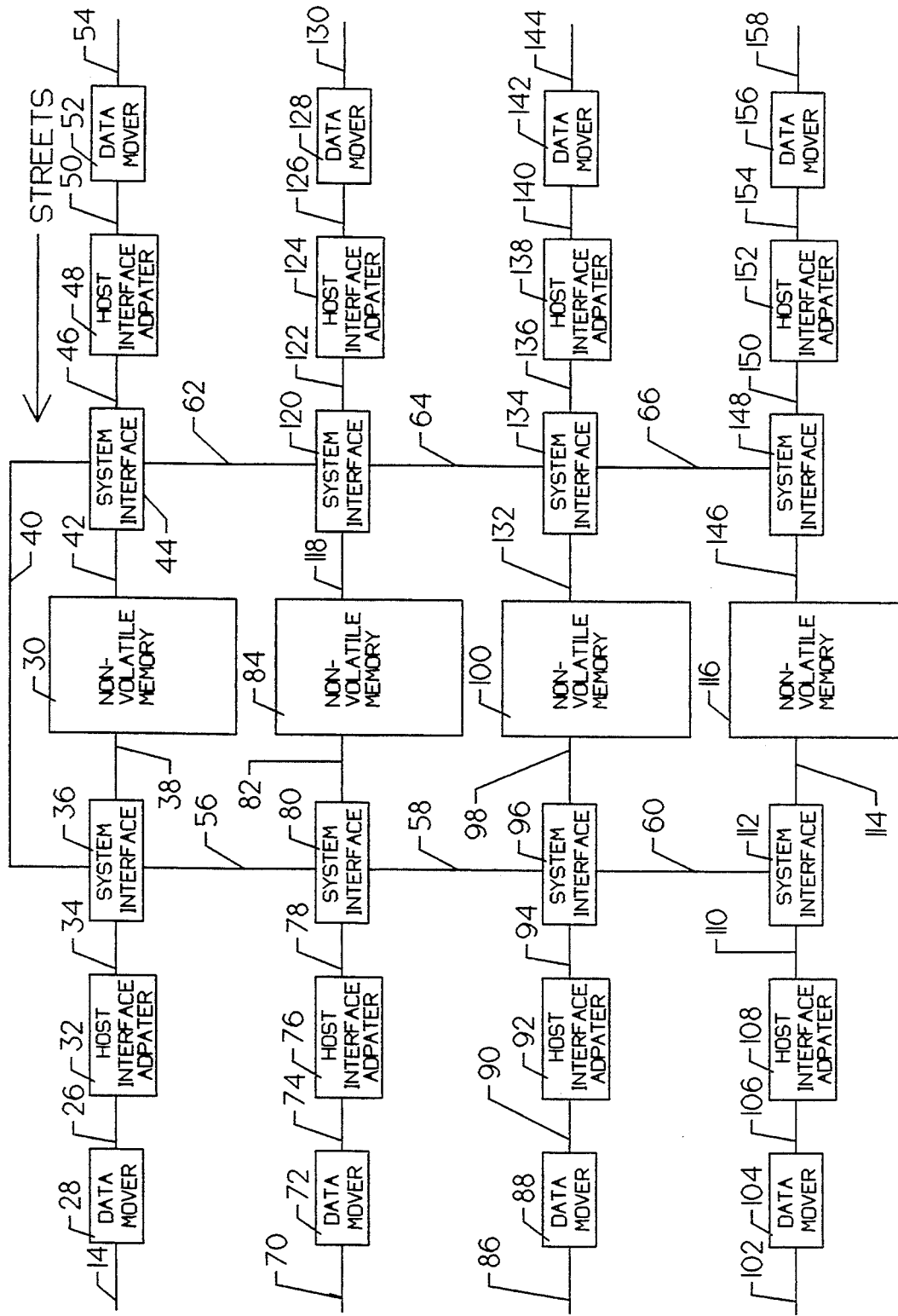
FIG. 3 is a block diagram of the interconnect of Outbound File Cache blocks.

FIG. 3 is a block diagram of the interconnect of the Outbound File Cache blocks within the system. The street architecture is a network of interconnecting system interface cards (SIF) that allow requesters on one SIF card to travel to another SIF card to access the nonvolatile memory (the System Interface Cards are indicated on FIG. 3 via reference numerals 36, 80, 96, 112, 44, 120, 134 and 148). Each nonvolatile memory 30, 84, 100 and 116 is independent from the others. However, any nonvolatile memory block can be accessed by any SIF by way of the streets.

Data movers 28, 72, 88 and 104 are coupled to input ports 14, 70, 86 and 102, respectively. Similarly data movers 52, 128, 142 and 156 are coupled to input ports 54, 130, 144 and 158, respectively. Host interface adaptor 32 is coupled to data mover 28 via fiber-optic interface 26 and further coupled to system interface 36 via wire 34. Host interface adaptor 76 is coupled to data mover 72 via fiber-optic interface 74 and further coupled to system interface 80 via wire 78. Host interface adaptor 92 is coupled to data mover 88 via fiber-optic interface 90 and further coupled to system interface 96 via wire 94. Host interface adaptor 108 is coupled to data mover 104 via fiber-optic interface 106 and further coupled to system interface 112 via wire 110. Host interface adaptor 48 is coupled to data mover 52 via fiber-optic interface 50 and further coupled to system interface 44 via wire 46. Host interface adaptor 124 is coupled to data mover 128 via fiber-optic interface 126 and further coupled to system interface 120 via wire 122. Host interface adaptor 138 is coupled to data mover 142 via fiber-optic interface 140 and further coupled to system interface 134 via wire 136. Host interface adaptor 152 is coupled to data mover 156 via fiber-optic interface 154 and further coupled to system interface 148 via wire 150.

Nonvolatile memory 30 is coupled to system interface 36 via wire 38 and further coupled to system interface 44 via wire 42. Nonvolatile memory 84 is coupled to system interface 80 via wire 82 and further coupled to system interface 120 via wire 118. Nonvolatile memory 100 is coupled to system interface 96 via wire 98 and further coupled to system interface 134 via wire 132. Nonvolatile memory 116 is coupled to system interface 112 via wire 114 and further coupled to system interface 148 via wire 146.

System interface 96 is coupled to system interface 112 via wire 60 and further coupled to system interface 80 via wire 58. System interface 36 is coupled to system interface 80 via wire 56 and further coupled to system interface 44 via wire 40. System interface 120 is coupled to system interface 44 via wire 62 and further coupled to system interface 134 via wire 64. Finally, system interface 148 is coupled to system interface 134 via wire 66.

Wires 60, 58, 56, 40, 62, 64 and 66 represent the streets within the system architecture. Note that the nonvolatile memories 30, 84, 100 and 116 are distributed among the system interface cards 36, 80, 96, 112, 44, 120, 134 and 148. Each system interface card has its own local memory but may access any of the other nonvolatile memories 30, 84, 100 and 116 by taking the appropriate street to that particular nonvolatile memory.

The structure depicted in FIG. 3 is in the "A" power domain except for the data movers 28, 72, 88,104, 52,128, 142 and 156. A power domain is defined as the portion of a system that is driven by a particular group of power supplies. In the preferred embodiment, each power domain has two power supplies connected to two different AC entrances. For resilient purposes, the Outbound File Cache has two power domains, namely "A" and "B".

In the preferred embodiment, there is a redundant structure, identical to that contained in FIG. 3 (but not shown in FIG. 3), that is connected to the "B" power domain. Each nonvolatile memory 30, 84, 100, 116 then has two paths from data movers 28, 72, 88, 104, 52, 128, 142 and 156 that are in the "A" power domain and two paths from data movers 28, 72, 88, 104, 52, 128, 142 and 156 that are in "B" power domain (For example NVM 30 has paths to Data Mover 28 and Data Mover 52 in the "A" power domain. NVM 30 would also have the same paths to the Data Movers in power domain "B").

Figure 4:
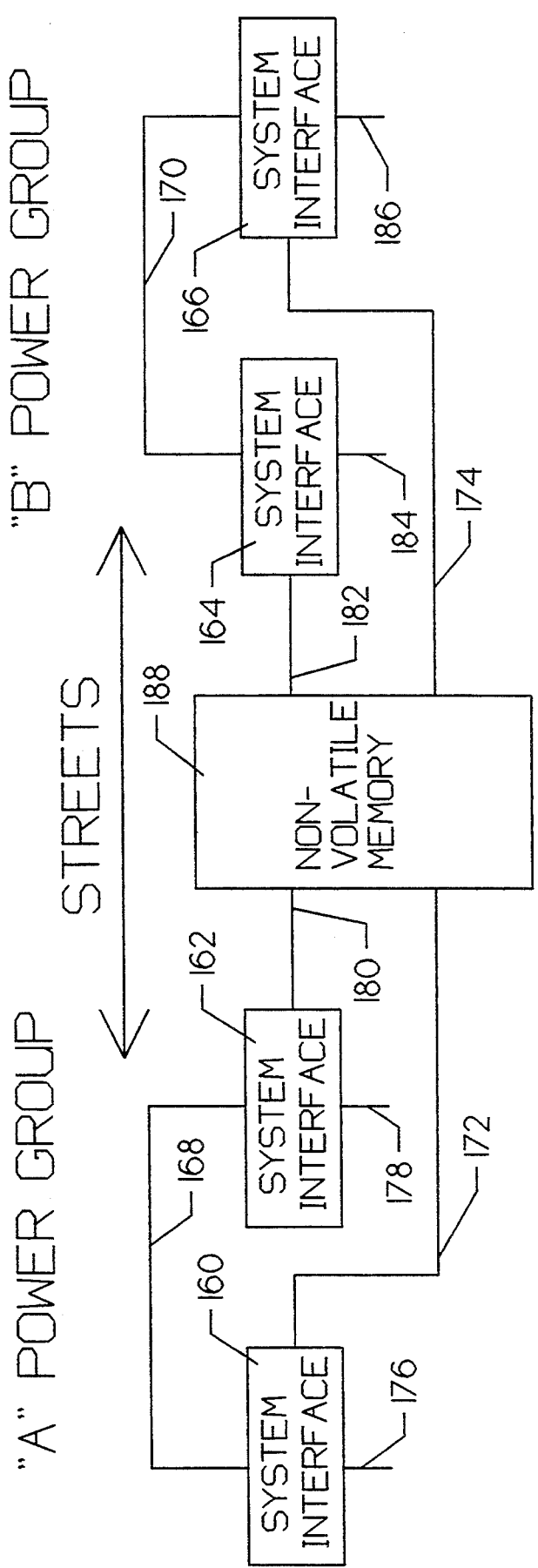
FIG. 4 is a detailed block diagram of the interconnect between system interface cards and the non-volatile memory.

FIG. 4 is a detailed block diagram of the interconnect between system interface cards and the nonvolatile memory. FIG. 4 shows both "A" power domain system interface cards and the redundant "B" power domain system interface cards. System interface 160 is coupled to street 176 and further coupled to system interface 162 via street 168. System interface 160 is also coupled to nonvolatile memory 188 via wire 172. System interface 162 is coupled to street 178 and further coupled to nonvolatile memory 188 via wire 180. Similarly, system interface 166 is coupled to street 186 and further coupled to system interface 164 via street 170. System interface 166 is also coupled to nonvolatile memory 188 via wire 174. System interface 164 is coupled to street 184 and further coupled to nonvolatile memory 188 via wire 182. It can be seen from this diagram that both "A" power domain system cards and "B" power domain system cards access the same nonvolatile memory 188.

Figure 5:
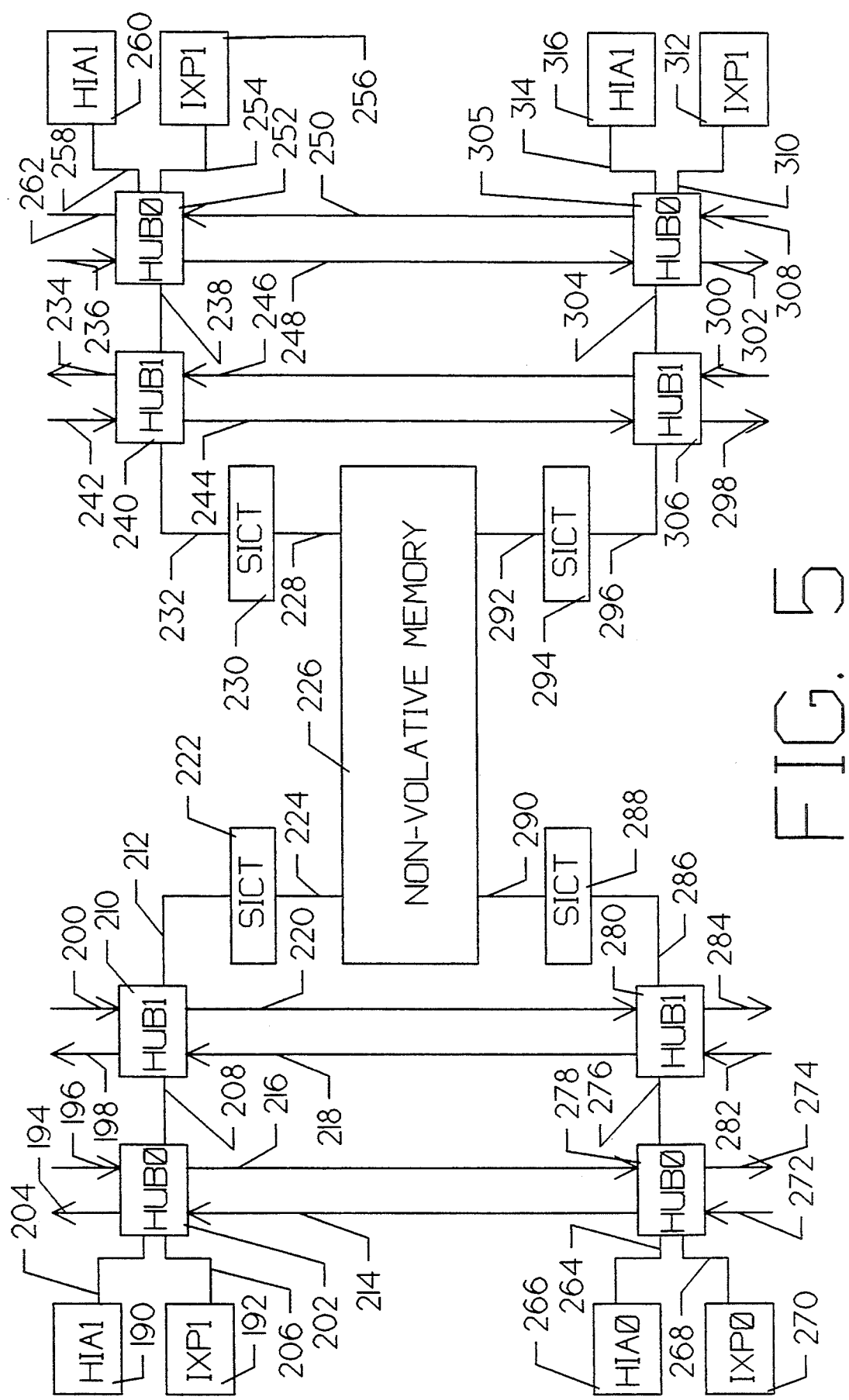
FIG. 5 is a detailed block diagram of a back panel block.

FIG. 5 is a detailed block diagram of a Backpanel block. An individual system interface (SIF) card (see FIG. 3, reference numerals 36, 80, 96, 112, 44, 120, 134 and 148) comprises one index processor (IXP), two HUB's (HUB0 and HUB1) and one storage interface controller (SICT). A Backpanel has four SIF cards interconnected as shown in FIG. 5.

In FIG. 3 the streets between SIF's 36, 80, 96, 112, 44, 120, 134 and 148 were represented by single lines 60, 58, 56, 40, 62, 64 and 66. In reality, the preferred embodiment contains two pairs of streets connecting each SIF card (and consequently, two HUB's). Both HUB0 and HUB1 can communicate either up the "UP" streets or down the "DOWN" streets.

The streets on HUB0 are called requester streets because only the IXP's and HIA's may direct requests to these streets. The streets on HUB1 are called responder streets because only the nonvolatile memory may direct responds to these streets. Having separate streets for requests and responses improves overall performance of the street network. However, it should be noted that this description does not limit the scope of the present invention to this configuration.

The HUB0 elements 202, 278, 252 and 305 have five interfaces each: (1) HIA, (2) IXP, (3) up street, (4) down street, and (5) an interface to the corresponding HUB1 element. The HUB1 elements 210, 280, 240 and 306 are the same electrical device as the HUB0 elements but the interfaces within the system are (1) SICT, (2) up street, (3) down street, (4) cross over interface to the other power domain and (5) interface to the corresponding HUB0 element.

Referring to FIG. 5, HUB0 202 is coupled to IXP1 192 via wire 206 and is further coupled to HIA1 190 via wire 204. HUB0 202 is also coupled to UP street 194 and DOWN street 196, and further coupled to HUB0 278 via UP street 214 and DOWN street 216. HUB0 278 is coupled to IXP0 270 via wire 268 and further coupled to HIA0 266 via wire 264. HUB0 278 is also coupled to UP street 272 and DOWN street 274 as are 218, 220, 198, 200, 282, 284, 234, 242, 244, 246, 298, 300, 236, 262, 248, 250, 302, and 308 respectively. HUB1 210 is coupled to HUB0 202 via wire 208 and further coupled to SICT 222 via wire 212. HUB1 is also coupled to street 198 and 200, and further coupled to HUB1 280 via streets 218 and 220. HUB1 280 is coupled to HUB0 278 via wire 276 and further coupled to SICT 288 via wire 286. HUB1 is also coupled to street 282 and street 284. HUB0 252 is coupled to IXP1 256 via wire 254 and further coupled to HIA1 260 via wire 258. HUB0 252 is also coupled to streets 236 and 262. HUB0 305 is coupled to IXP1 312 via wire 310 and further coupled to HIA1 316 via wire 314. HUB0 305 is also coupled to HUB0 252 via streets 248 and 250. Finally, HUB0 305 is coupled to streets 302 and 308. HUB1 240 is connected to HUB0 252 via wire 238 and further coupled to SICT 230 via wire 232. HUB1 240 is also coupled to streets 242, 234, 244, and 246. HUB1 306 is coupled to HUB0 305 via wire 304 and further coupled to SICT 294 via wire 296. HUB1 306 is further coupled to HUB1 240 via streets 244 and 246. Finally, HUB1 306 is coupled to streets 298 and 300. Non-volatile memory 226 is coupled to SICT 222 via wire 224, SICT 288 via wire 290, SICT 230 via wire 228 and SICT 294 via wire 292.

Figure 6:
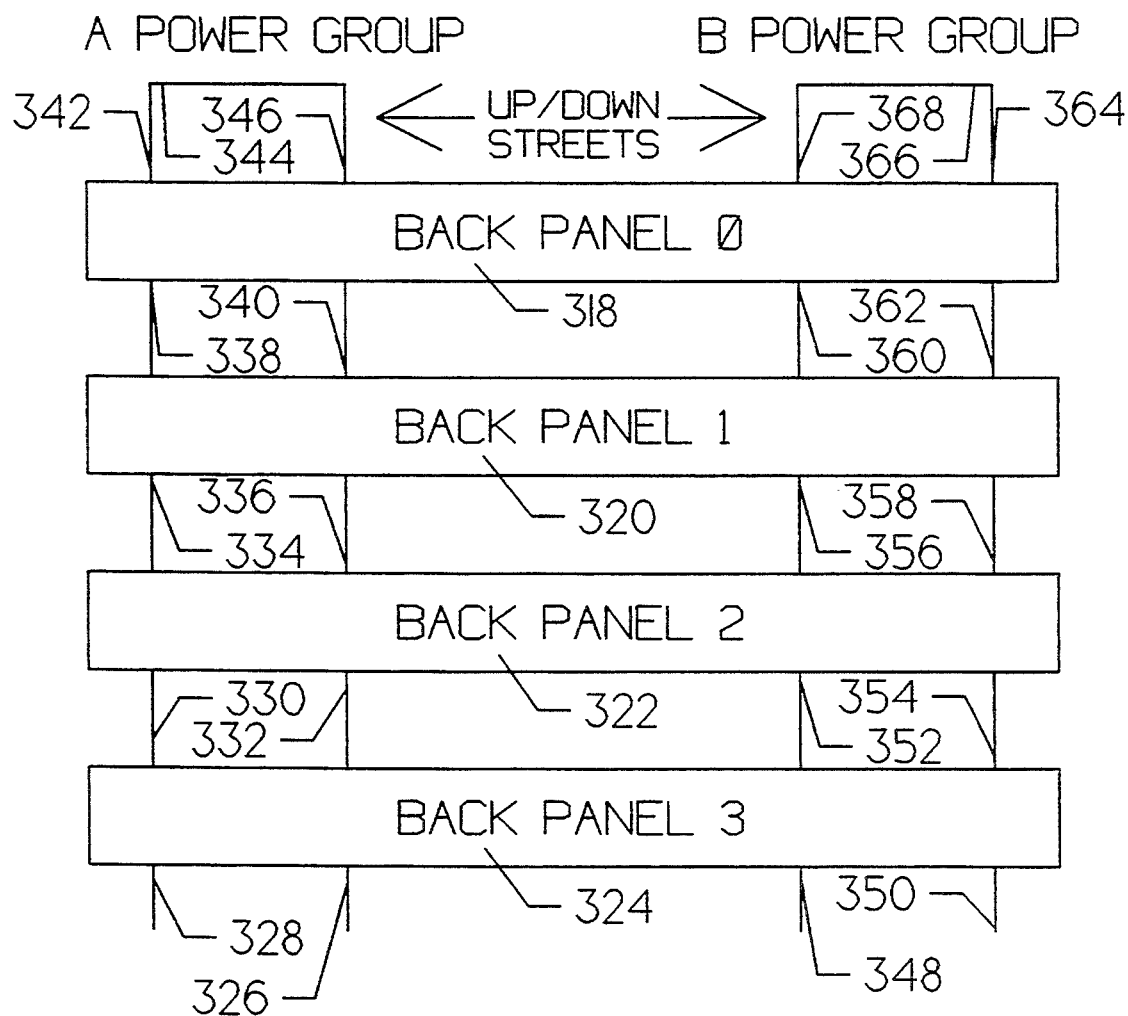
FIG. 6 is a detailed block diagram of four back panel blocks connected together.

FIG. 6 is a detailed block diagram of four backpanel blocks connected together. The Outbound File Cache 24 (see FIG. 1) may have anywhere from one (1) to sixteen (16) backpanels in the preferred mode. However, the present invention is not limited to this number. FIG. 5 contains a block diagram of what is contained in each of the backpanel blocks (i.e. Backpanel-0 318, Backpanel-1 320, Backpanel-2 322, and Backpanel-3 324). Backpanel-0 318 is coupled to Backpanel-1 320 via streets 338, 340, 360, 362. Backpanel-2 322 is connected to Backpanel-1 320 via streets 334, 336, 356, and 358. Backpanel-3 324, is connected to Backpanel-2 322 via streets 330, 332, 352, 354. Backpanel-0 318 is further coupled to streets 342 and 346 where street 342 is coupled to street 346 via street 344. Similarly, Backpanel-0 318 is coupled to streets 368 and 364 where street 368 is coupled to street 364 via street 366. Finally, Backpanel-3 324 is coupled to streets 328, 326, 348 and 350.

Figure 7:
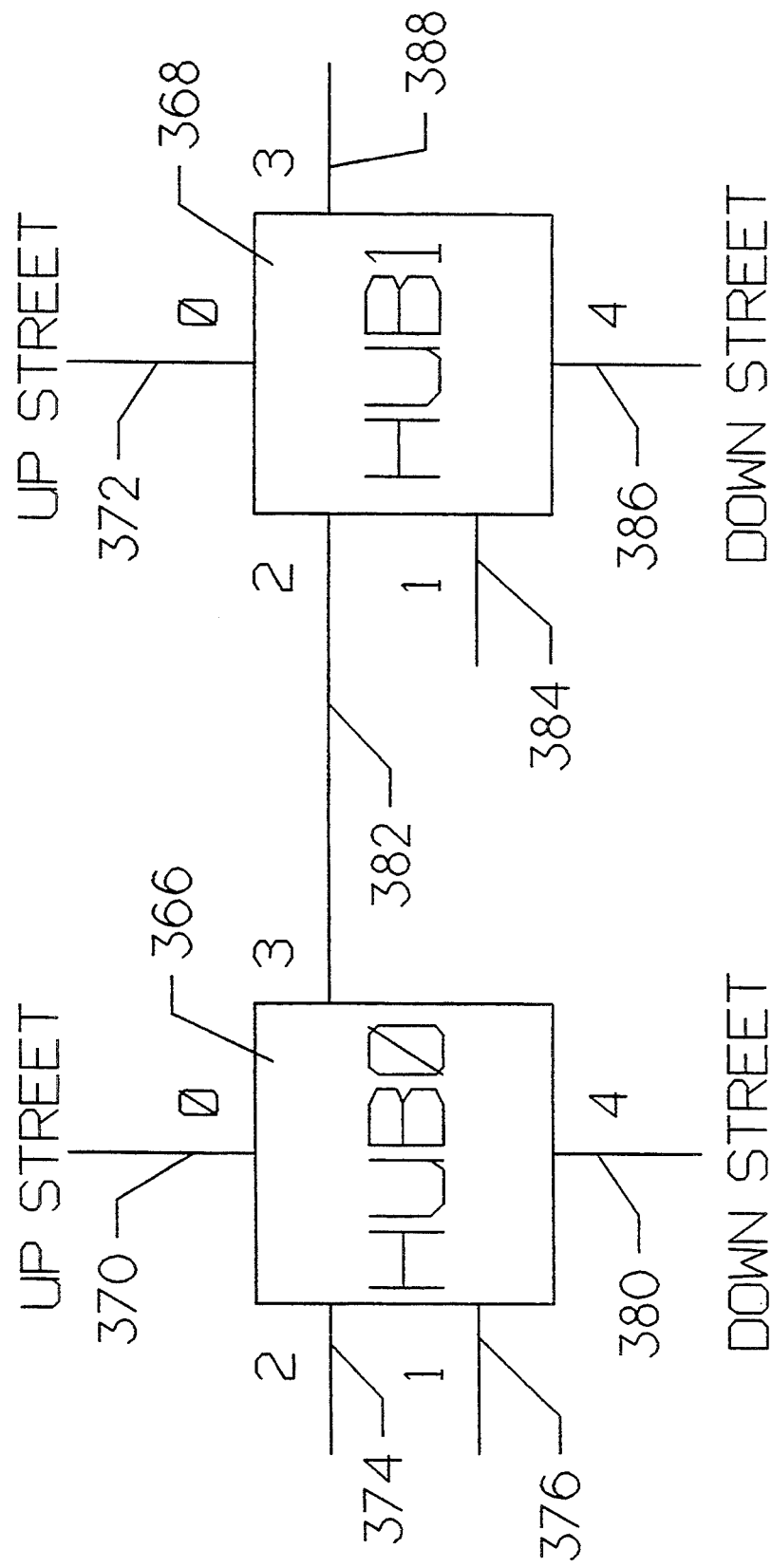
FIG. 7 is a block diagram of the preferred configuration of the two HUB elements contained in a system interface block.

FIG. 7 is a block diagram of the preferred configuration of the two HUB elements contained in a system interface block. HUB0 366 and HUB1 368 are identical gate array devices. The HUB gate array comprises the logical interconnect between an index processor (IXP), a host interface adaptor (HIA) and a non-volatile memory (NVM).

Each HUB has five interfaces to which it can route information packets. Because there is only one HUB type, the HUB identifier (HUBID) is used for differentiating between HUB0 366 and HUB1 368. For HUB0 366, the five interfaces are the IXP 376, HIA 374, up-street 370, down-street 380 and an interface to HUB1 282. For HUB1, the five interfaces are NVS 384, interface to HUB0 382, up-street 382, down-street 386 and the interface to the cross-over HUB 388. HUB0 is coupled to HUB1 via wire 382.

The movement of packets between HUB gate arrays follows conventional requests-acknowledge protocols. Available lines, a header destination, address and identification straps determine the path selection. Localized control allows a HUB to stack, purge a rogue packet, or grant priority to the appropriate interface.

Figure 8:
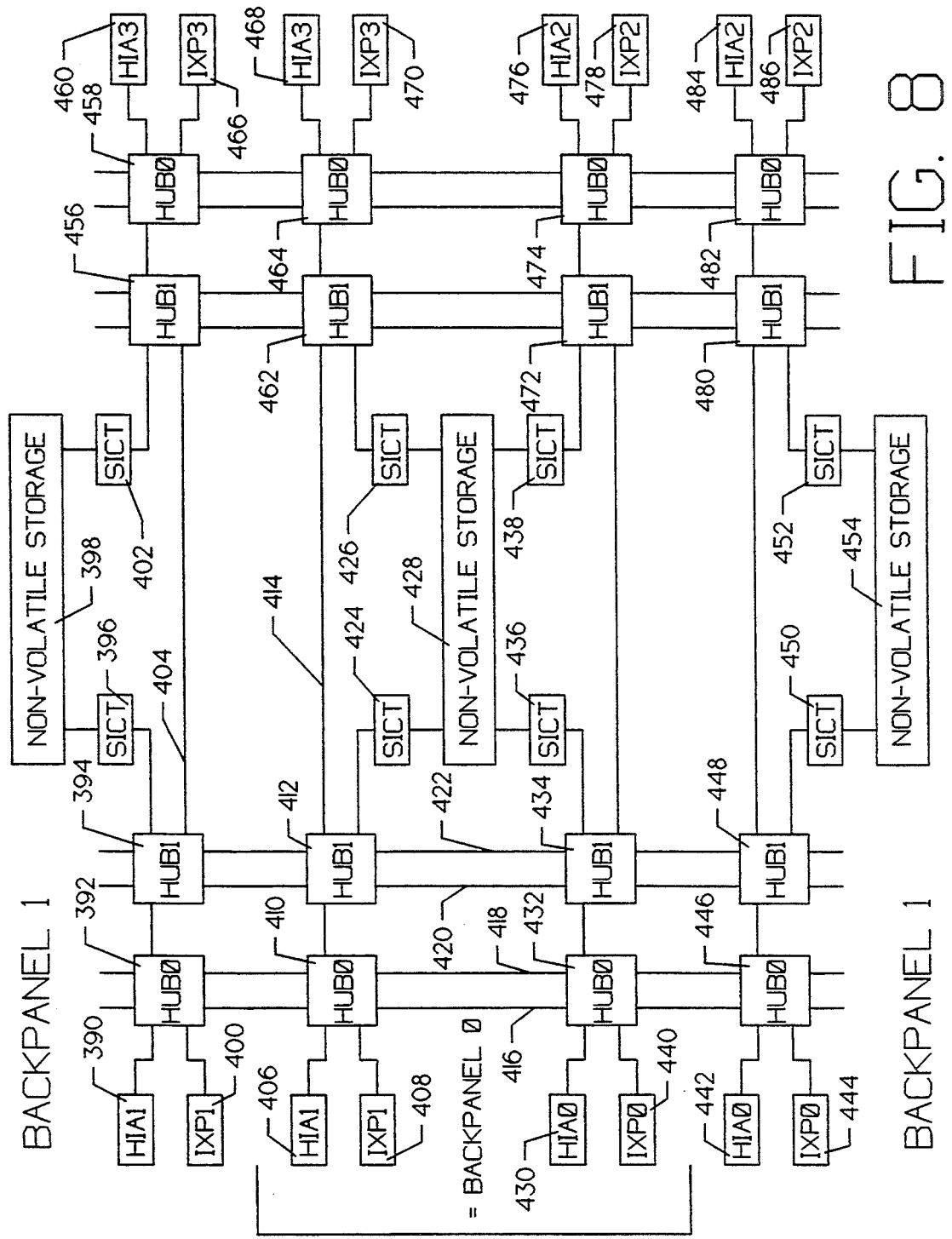
FIG. 8 is a block diagram of the preferred HUB configuration for one cabinet.

FIG. 8 is a block diagram of the preferred HUB configuration for one cabinet. The numbers in the boxes for the IXP's 400, 408, 440, 444, 446, 470, 478 and 486 indicate system interface cards (SIF's). As indicated earlier, one system interface card consists of one IXP, one SICT and two HUBs (HUB0 and HUB1). Connection between SIF0 and SIF1 is by cable, which is similar for SIF2 and SIF3. The configuration resembles a ladder with the streets (for example streets 416, 418, 420, 422) being the vertical connections and the x-overs (for example x-over 404 and 414) being the rungs. The SIF's on the left are in a different power plane from those on the right.

As can be seen from the diagram, Backpanel-0 is coupled to SIF-0 (containing elements IXP0 440, HUB0 432, HUB1 434 and SICT 436), SIF-1 (containing elements IXP1 408, HUB0 410, HUB1 412 and SICT 424), SIF-2 (containing elements IXP2 478, HUB0 474, HUB1 472, and SICT 438), and SIF-3 (containing elements IXP3 470, HUB0 464, HUB1 462, and SICT 426). Backpanel-0 also contains its own non-volatile memory 428 which can be accessed by any one of the four SIFs. Backpanel-1 also has four SIFs; SIF-0 (containing elements IXP0 444, HUB0 446, HUB1 448 and SICT 450), SIF-1 (containing elements IXP1 400, HUB0 392, HUB1 394, and SICT 396), SIF-2 (containing elements IXP2 486, HUB0 482, HUB1 480 and SICT 452) and SIF-3 (containing elements IXP3 466, HUB0 458, HUB1 456 and SICT 402). Backpanel-1 also contains its own non-volatile memory 392. Backpanel-0 and Backpanel-1 are coupled via the streets connections (e.g., streets 416, 418, 420, and 422).

FIG. 9 is a table containing the output priority scheme for the HUB0 and HUB1 elements. There are five priority sections in a HUB element; one for each interface. Each of the priorities of the five output interfaces is independent from the others. Conventional snap-shot priority is used on the IXP and HIA interfaces for HUB0 and on the NVS and the CROSSOVER interfaces for HUB1. Snap-shot priority allows requests that are received simultaneously, to be serviced in a high to low priority—before another snap-shot is taken.

The priority on the street output node is designed such that the street is given the highest priority. Only when the R-flag (release a local requester to the street) is set, will the street node allow another requester on the street. (See FIG. 10 for the HUB control format.) This assumes that the street request traffic is continuous. Of course, if there is no request from the street to street output nodes, then the local requesters (IXP or internal for HUB) have access to the street.

The R-Flag is set by all requesters including IXP's, HIA's and NVS's. The order of priority at each street interface remains the same whether the R-Flag is set or not, however the snap changes depending on the value of the R-Flag. If the street request has the R-Flag set, then one local requester will follow the street request out of the street output node. The priority then resnaps. The R-Flag is cleared when the street request leaves the street node. If the street request does not have the R-Flag set, then the street request goes out the street output node and the priority resnaps. The R-Flag remains cleared in this instance. If the street request R-Flag is set and there are no local requesters, the R-Flag remains set upon leaving the street node. The R-flag either remains set or it is cleared by the street requester. However, it is never cleared by the local requesters.

The internal interface of HUB0 and HUB1 are also designed such that the streets (UP/DOWN) have the highest priority for access. If both the UP and DOWN streets are snapped simultaneously, then priority resnaps after the DOWN has been serviced. The R-Flag has no effect on these interfaces. FIG. 9 contains the output priority for the HUB0 and HUB1 interfaces.

FIG. 10 is a diagram defining the HUB control format. The HUB uses a request-acknowledge protocol in transferring data packets. The HUB, upon detection of the EXTEND LINE going high, determines by the destination address to which interface the request is directed. If there is no contention at that output node, the packet goes out and an acknowledge is sent back to the requester. This acknowledge informs the requester that it may send another packet. If this request is in contention with another requester also attempting to go out the same interface or node, then an acknowledge is not returned until this new request is serviced. When the initial request receives priority, a response is sent back to the requester and the HUB begins transmitting the packet to its destination. When a packet is received on any HUB interface, the packet is always stored in a Random Access Memory (RAM). If the priority for this output node is busy, control will switch over and take the packet from the RAM once the previous request is finished. Therefore, the request sitting in RAM forms a request to the output node priority determined by a destination address and available line. Once the previous request is through transmitting and this request is next in the priority que, the control will act on this request.

Because it is important to be able to redirect the packet when a particular interface is not available, the AVAILABLE line enters into the formation of the request to a particular interface as priority. The interfaces that have this ability are the streets and the interfaces to the NVS via the SICT block.

The S-Flag is set by the requester and informs the HUB which direction to take on the streets (either UP or DOWN). S-Flag = 0 is defined as an UP street direction. S-Flag = 1 is defined as a DOWN street direction.

As stated earlier, the R-Flag is set by all requesters. The HUB only recognizes the R-Flag on an in-coming street. For example, if a HIA makes request to the NVS in a different Backpanel, the immediate HUB0 will direct the packet to the appropriate street. The receiving HUB0 on that street then recognizes the R-Flag. This receiving HUB0 then permits one local requester to follow the street out of the output node. The R-Flag is cleared and the local requester follows the street requester on the street. If there are no other requesters in the que for this street, then the R-Flag remains set.

The C-Flags are used to route a packet between HUB elements, when using the crossover path between power planes. These flags are set by the HUB's themselves. The C0 Flag is set when HUB0 sends a packet to HUB1 via the internal interface. The C1 Flag is set when HUB1 sends a packet to the adjacent HUB1 via the crossover interface. The C1 Flag is cleared by the receiving HUB1 once the packet is transmitted by HUB1. Similarly, the C0 Flag is cleared after the data has been received by the receiving HUB0 once the packet is transmitted.

The unit identification field, bits 8–11 of the word, are used to addresses a particular UNIT (See FIG. 11). The Backpanel identification field, bits 12–15, are used to addresses one of the sixteen Backpanels used in the preferred mode.

FIG. 11 is a diagram defining the unit identification field. All relevant UNIT's have a Unit Identification code associated with them. The unit identification code is used for addressing a particular UNIT (see FIG. 10).

Figure 12:
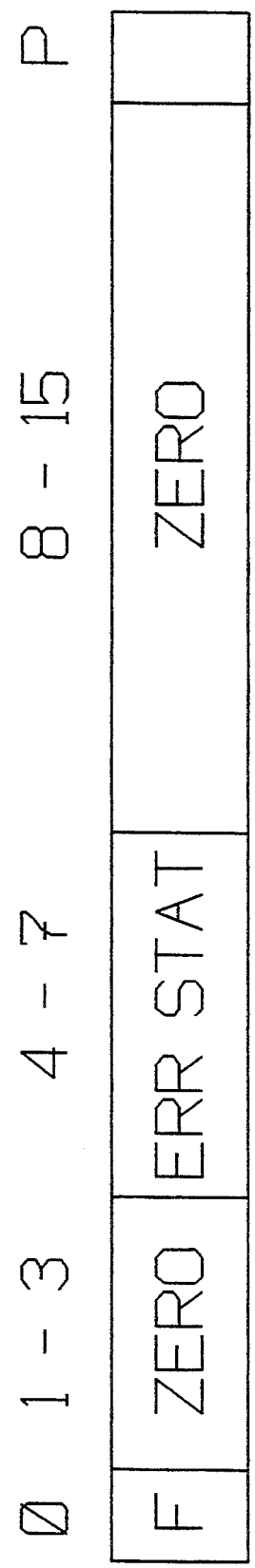
FIG. 12 is a diagram defining the HUB error status format.

FIG. 12 is a diagram defining the HUB error status format. The "F" bit zero signifies the error flag. This bit is set when the HUB detects a first time occurrence error. The remainder of the fields contained in FIG. 12 are available to report the status of miscellaneous errors including HUB transmission errors, parity errors, and time-out errors. However, at this time the HUBs are setting ERR STAT field (4–7) to zeroes.

Figure 13:
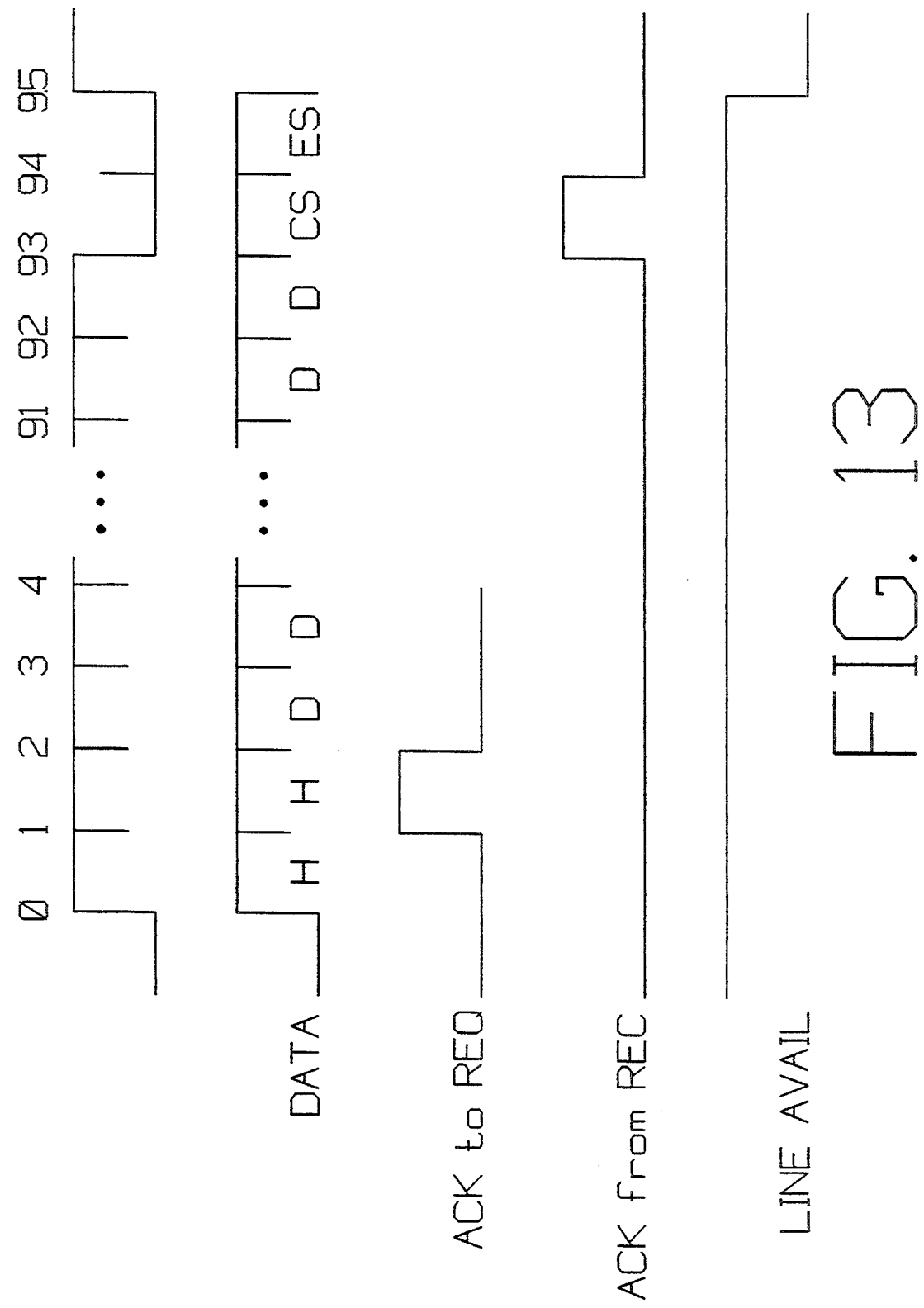
FIG. 13 is a timing diagram for the basic interface for the transmission, of one maximum length packet.

FIG. 13 is a timing diagram for the basic interface for the transmission of one maximum length packet. All interface timing (for the preferred embodiment of the HUB) is on a 50 nanosecond (ns) time step. Also, the diagram assumes that the interface to which the request was directed was not busy.

The "Extend" signal goes active at time-step zero, indicating that the data that is being received is now valid. The requester HUB then sends out two header words along with data on the "Data" line to indicate, among other things, with what unit the requester wants to communicate. The HUB always sends an "ACK" back to requestor. This "ACK to REQ" signal indicates to the requester that the RAM in the receiving HUB now has room for another packet. The pulse contained on the "ACK from REC" signal indicates the latest time an acknowledge can be received at the HUB for continuous requests to the next HUB or unit. This acknowledge can be received up to the maximum of the timer associated with that particular interface.

If a HUB detects a transmission error, the "AVAILABLE" line signal will go inactive 100 ns after the "EXTEND" line goes inactive (in this diagram 100 ns after pulse number 93). This will shut down that particular street and force the HUB elements to re-route the request or response (see FIG. 14).

Figure 14:
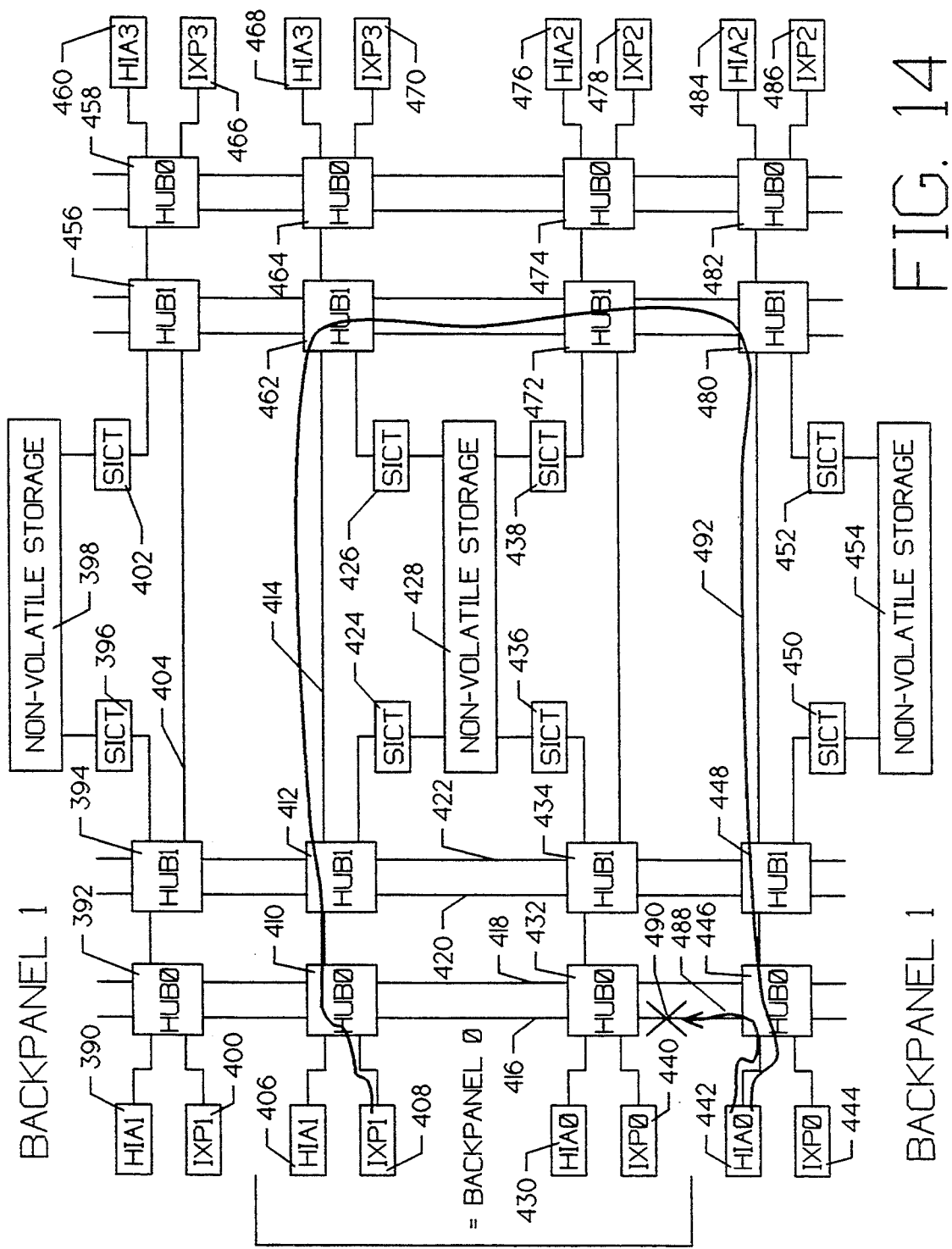
FIG. 14 is a block diagram showing one of the automatic rerouting capabilities of the present system.

FIG. 14 is a block diagram showing one of the automatic rerouting capabilities of the present system.

An AVAILABLE line is connected between any two components (see FIG. 14). If for example, HIA0 442 wants to send a request to the IXP1 408, then an AVAILABLE line from HUB0 432 to HUB0 446 must be active indicating that HUB0 432 is ready to receive the request. If this line is inactive, then HUB0 446 will not send a request. When HUB0 432 detects an error on the interface from HUB0 446, HUB0 432 de-activates the AVAILABLE line, thereby shutting down the HUB0 446 up street port.

The HUBs themselves can detect when a AVAILABLE line goes inactive on the streets or the HUB1/SICT interface and can take appropriate action to reroute packets along a different path such that there is no interruption of traffic on the streets or HUB1/SICT interface. There are two conditions when the HUB will start redirecting packets. One is when a receiving interface detects an error and drops the available line to the sender. The sender HUB will then redirect the packet. The second is when the receiving interface does not return an acknowledge in a specified amount of time. The sending HUB starts a timer when the packet is transmitted and when this timer expires (because of not receiving an acknowledge) the HUB will start redirecting packets.

The HUB can detect up to 11 different packet interface errors ranging from a parity error to a stuck extend line error. Using FIG. 14, suppose HIA0 442 attempts to send a packet up the street 416 to IXP1 408, but either an error on a previous packet on the UP street has been detected or there has been a break at point 490 causing that particular interface not to be available. The HUB0 446 then redirects the packet from HIA0 442 to IXP 408 via the marked up path 492. The reason for allowing the redirection of the packet to the B power domain is because the Outbound File Cache will be able to run even if a SICT card looses power.

Not only do the request streets have rerouting capability, but the response streets do as well. If the UP street 420 on HUB1 448 is not available, and the non-volatile storage 454 and SICT 450 want to send a response to HIA1 406, the new alternate path to HIA1 406 will also follow marked up path 492 beginning at HUB1 448.

The HUB1 448/SICT 450 interface also has the capability to redirect packets when the HUB1 448/SICT 450 interface encounters an error such that the SICT 450 is not available. The alternate path to the non-volatile storage 454 is now via the crossover to the adjacent HUB1 480 and to the SICT 452 and finally to the non-volatile storage 454.

Figure 15:
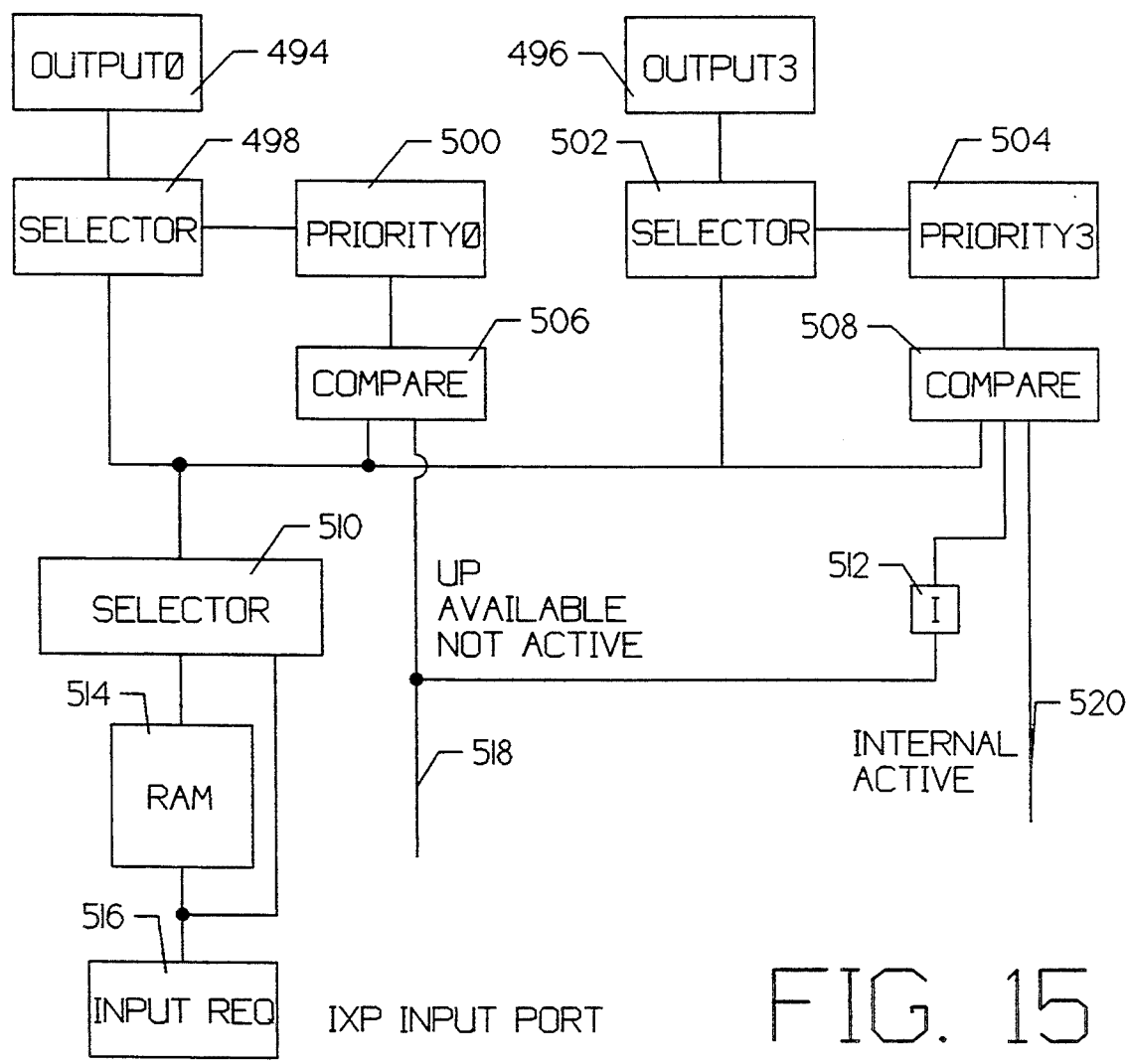
FIG. 15 is a block diagram illustrating the basic methodology of the automatic re-routing capabilities of the present system.

FIG. 15 is a block diagram illustrating the basic methodology for the automatic rerouting capability of the present invention. The block diagram in FIG. 15 corresponds to a HUB0 re-route. In addition, the diagram assumes that the input requester is the IXP interface and the desired output port is the UP street (OUTPUT0 494). Finally, the diagram assumes that the UP AVAILABLE line 518 has gone inactive because of a previous fault on the UP street and therefore the HUB0 will instead re-route said input request to the internal interface (OUTPUT3 496).

The input request register 516 receives the packet from the IXP. Although the input request has requested access to the UP street (OUTPUT0 494), COMPARE 506 is deactivated because the UP AVAIL line has gone inactive and therefore COMPARE 506 forces the IXP input request to go out OUTPUT3 496 (the internal interface) when OUTPUT3 496 is available. If OUTPUT3 496 is busy, then the IXP packet is stored in RAM 514 until such time that priority for OUTPUT3 496 is cleared and ready to accept the next request. INVERTER 512 activates COMPARE 508 because the UP AVAILABLE line 518 is low (not active due to an error). The output of COMPARE 508 is provided to PRIORITY3 504 which follows the standard priority protocol discussed in FIG. 9. When priority is established, SELECTOR 510 allows the IXP packet to go out the OUTPUT3 496 interface.

When a request comes into the HUB, the available line is checked to see if it is active. If it is active at the beginning of the packet, the packet will be transmitted even though the AVAILABLE line 518 may go inactive at any time during the transmission of the packet. The HUB takes a snap-shot of the AVAILABLE line 518 at the beginning of the request and holds this information in a designator until the packet has been transmitted. At the completion of the packet, the HUB then drops the AVAILABLE 518 line designator within the HUB.

It is possible for more than one request to come into the HUB and attempt to simultaneously go out the same port. For example, if the IXP and a request from the UP street arrive at the same time attempting to go up the UP street, the priority (as discussed earlier) allows the UP street request to go first and the IXP is held in the que (RAM). Because both requests arrived simultaneously with the AVAILABLE line active, a designator is set up in the UP street node priority named PRIORITYHOLD. If the AVAILABLE line now goes inactive when the IXP is in the queue (RAM), the PRIORITYHOLD designator must be cleared because the IXP request that was in the queue can now go out the internal OUTPUT3 496 interface.

The disclosure contained herein does not in any way limit the scope of this invention to a one input/two output rerouting scheme. One skilled in the art would recognize that the present invention can readily be adapted to a multiple input/multiple output rerouting scheme.

Figure 16:
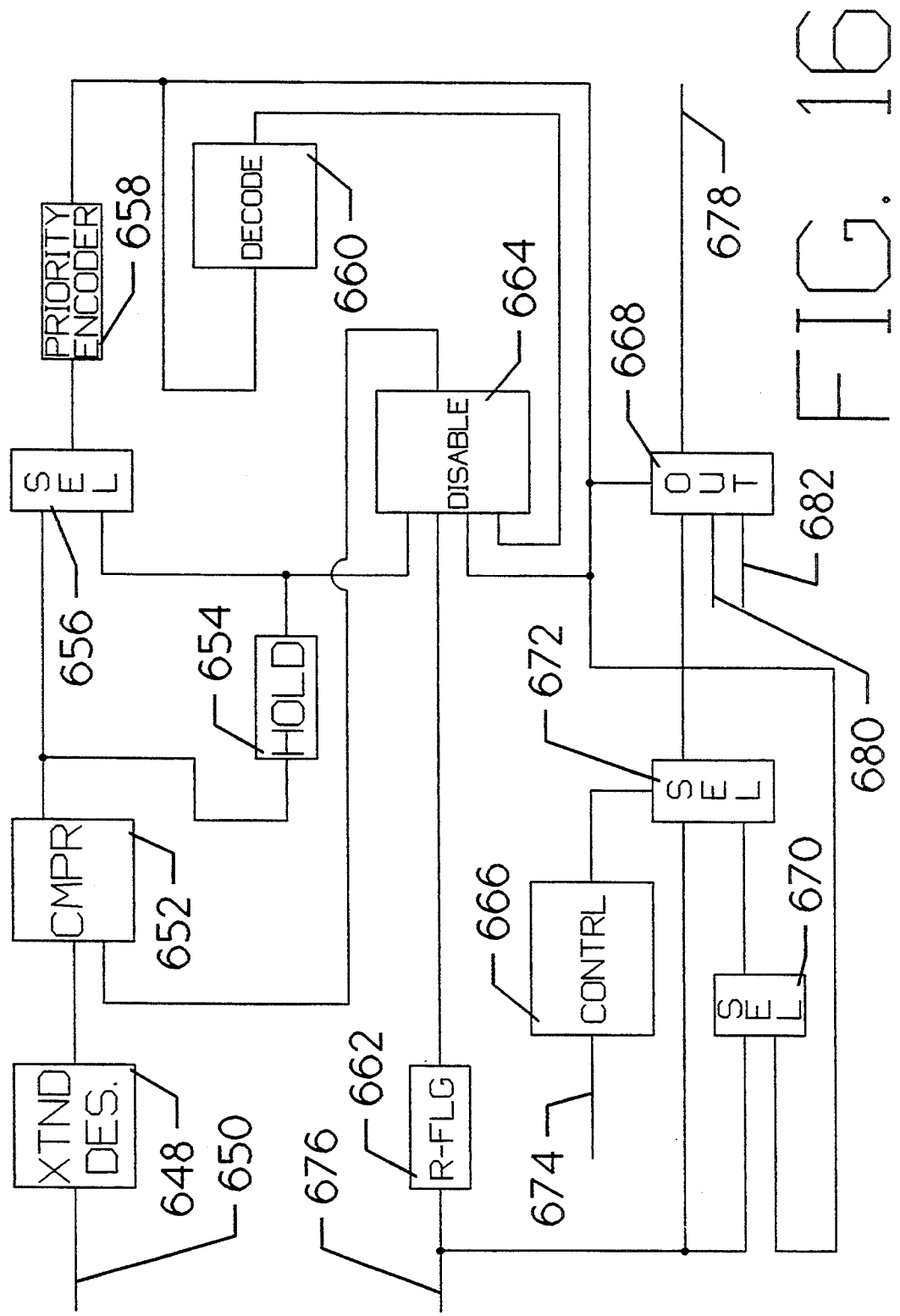
FIG. 16 is a block diagram showing the HUB Street priority circuitry.

FIG. 16 is a block diagram showing the HUB street priority circuitry. The operation of said circuitry is as follows: When the extend designator 648 gets set from an incoming street packet, a compare 652 is made to see if the request is continuing on the street. If other requesters are present in the same time frame as the street request, then the PRIORITYHOLD register 654 will store all of these requests. The priority encoder 658 determines the order the requests are to be serviced. The priority order for the street output node is (1) street, (2) IXP, (3) HIA and (4) request from HUB1. A priority disable designator 664 gets set once the priority encoder goes active. The primary purpose of the priority disable designator 664 is to disable the compare logic 652 so that if other requests are present, they will be held out of priority encoder 658 until all requests that are snapped in the same time frame are serviced.

The R-flag designator 662 gets set if bit one (1) of the packet header is enabled. The R-flag designator feeds the priority disable designator 664 and determines when priority should open back up for another re-snap or service the requesters that are in the PRIORITYHOLD register. The R-flag is only present in the header of the packet. Therefore, since the packet may be many transfers long, control into the R-flag's SEL 672 only selects the R-flag out of the header during the first transfer and then switches back to normal packet data.

The priority encoder 658 drives into the R-flag SEL 670 which determines whether the R-flag should remain set or should be cleared out when leaving the HUB via the selector 672 and selector out 668. The selector out 668 is required because up to four registers (street, IXP, HIA and internal) can exit the HUB via the selector.

The priority decode register 660 latches the output of priority encoder 658. When the packet transmission is complete, the priority decode register 660 is used to clear all of the priority registers.

FIG. 17 is a set of functional block diagrams for a HUB element. As discussed earlier, the HUB0 element contains five interfaces; (1) IXP, (2) HIA, (3) UP street; (4) DOWN street, and (5) the crossover or internal interface. These five interfaces are indicated on FIG. 17 by the wires marked P1, P2, UP, DOWN and P3 respectively. Each one of these interfaces is coupled to an interface (I/F) block. I/F blocks 522, 548, 572, 598 and 622 are input interface blocks while I/F blocks 546, 568, 592, 616 and 642 are output interface blocks. The input of an input interface block and the output of an output interface block for a given interface signal are coupled together and tied to that interface signal. For example, the input of I/F block 522 and the output of I/F block 546 are coupled together and connected to the UP street. Similarly, the input of I/F block 548 and the output of I/F block 568 are coupled together and connected to the DN street. The same holds true for the P1, P2 and P3 interface blocks.

Figure 17A:
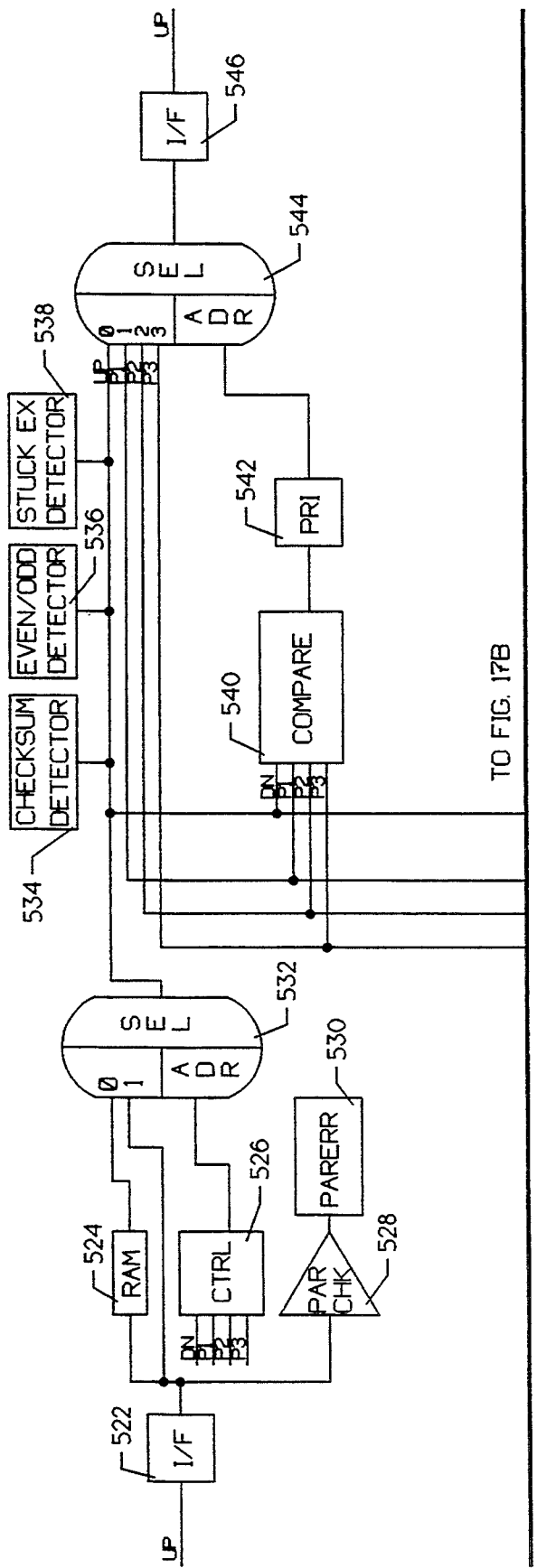
FIG. 17A is a first functional block diagram showing a first portion of the HUB element as shown in FIG. 17.

FIG. 17A is a functional diagram of the UP street decode circuitry within the HUB element. I/F 522 is coupled to RAM 524, SEL 532, and PARCHK 528. I/F 522 provides the input signal from the up-street to the HUB circuitry. RAM 524 stores the packets that are received through the UP interface 522. PARCHK 528 performs a parity check on in-coming data from I/F 522 and if an error is detected, PARERR 530 issues a parity error. SEL 532 is coupled to RAM 524, I/F 522, CTRL 526 and the UP input port of SEL 544. SEL 532 either selects a request from RAM 524 or directly from I/F 522 depending on the value received from CTRL 526. CTRL 526 determines which request to select based on values of the signals SEL 532 output, SEL 576 output, SEL 602 output and SEL 626 output. The output of SEL 532 is also coupled to checksum detector 534, even/odd detector 536 and stuck-extend detector 538. The checksum detector 534 contains a register which is initially loaded with the second header of the request. The first data word is XOR'd with this checksum register and the result is placed in the checksum register. This operation continues until the EXTEND line goes inactive. Once the EXTEND line goes inactive, the HUB receives a checksum word and this word is compared with the contents of the checksum register. If checksum word and the checksum register do not compare, the "checksum error" flag is set. The even/odd detector 536 checks to insure that the EXTEND line was active for an even number of cycles. If not, an error flag is set. Stuck extend detector 538 determines if the extend line has been stuck in the active mode greater than 94 cycles. If it has, an error flag is set. SEL 544 selects one of four signals to be placed on the UP street. SEL 544 is coupled to I/F 546 and further coupled to the following four input signals; (1) the output of SEL 532, (2) the output of SEL 576, (3) the output of SEL 602 and (4) the output of SEL 626. PRI 542 is coupled to the select lines of SEL 544. PRI 542 determines which of the four signals has priority. The input of PRI 542 is coupled to compare 540. Compare 540 samples and compares certain control bits from the following four signals; (1) the output of SEL 532, (2) the output of SEL 576, (3) the output of SEL 602 and (4) the output of SEL 626. Compare 540 then provides the result to PRI 542.

Figure 17B:
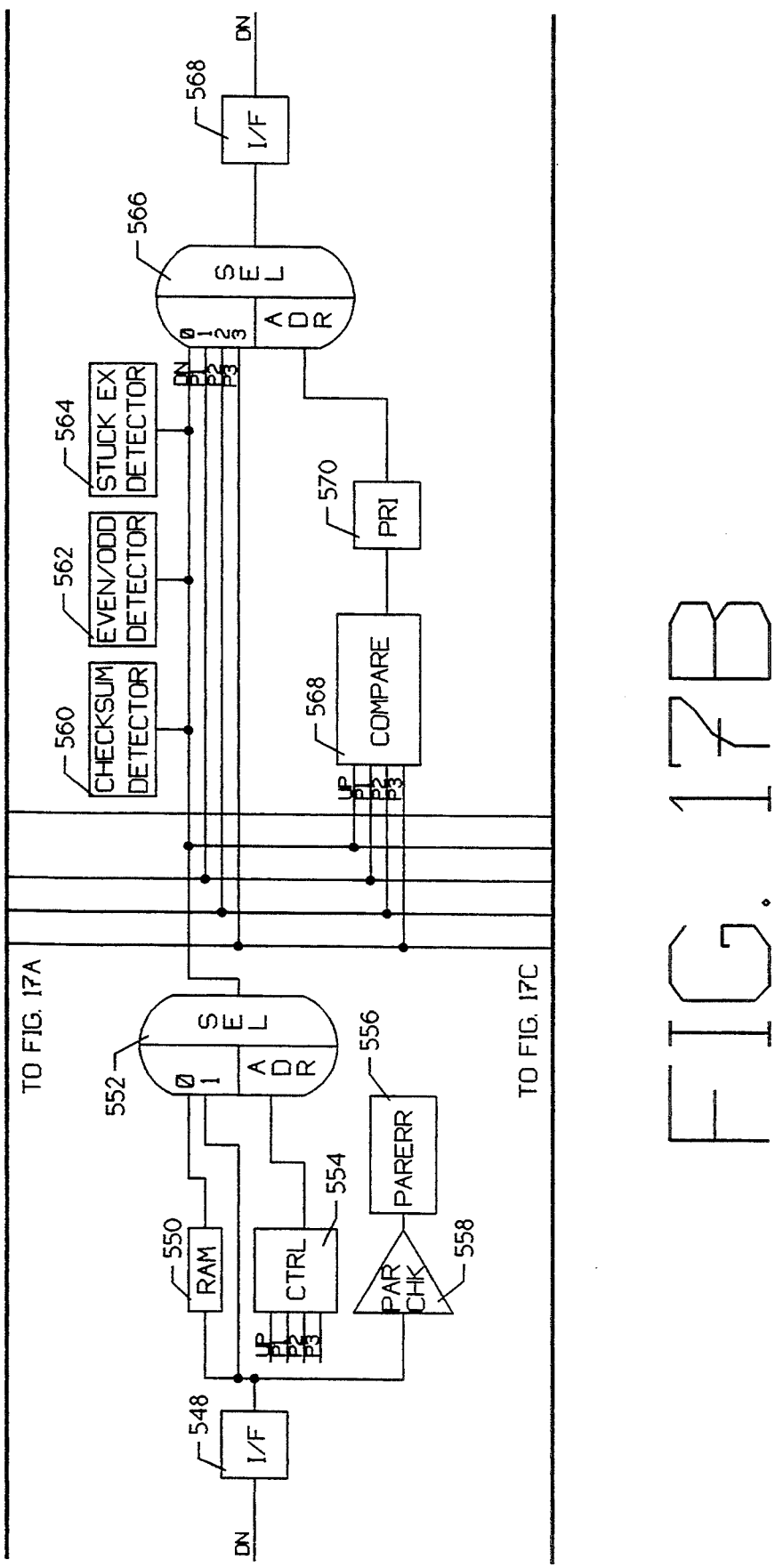
FIG. 17B is a second functional block diagram showing a second portion of the HUB element as shown in FIG. 17.

FIG. 17B is a functional diagram of the DOWN street decode circuitry within a HUB element. I/F block 548 is coupled to RAM 550, SEL 552, and PARCHK 558. I/F 548 provides the input signal from the down-street to the HUB circuitry. RAM 550 stores the packets that are received through the DOWN street interface 548. PARCHK 558 performs a parity check on in-coming data from I/F 548. If an error is detected PARERR 556 issues a parity error. SEL 552 is coupled to RAM 550, I/F 548, CTRL 554 and the DOWN input port of SEL 566. SEL 552 either selects a request from RAM 550 or directly from I/F 548 depending on the value received from CTRL 554. CTRL 554 determines which request to select based on the values of the signals SEL 552 output, SEL 576 output, SEL 602 output and SEL 626 output. The output of SEL 552 is also coupled to checksum detector 560, even/odd detector 562 and stuck-extend detector 564. The checksum detector 560 contains a register which is initially loaded with the second header of the request. The first data word is XOR'd with this checksum register and the result is placed in the checksum register. This operation continues until the EXTEND line goes inactive. Once the EXTEND line goes inactive, the HUB receives a checksum word and this word is compared with the contents of the checksum register. If the checksum word and the checksum register do not compare, the "checksum error" flag is set. The even/odd detector 562 checks to insure that the EXTEND line was active for an even number of cycles. If not, an error flag is set. Stuck extend detector 564 determines if the EXTEND line has been stuck in the active mode for greater than 94 cycles. If it has, an error flag is set. SEL 566 selects one of four signals to be placed on the DOWN street. SEL 566 is coupled to I/F 568 and further coupled to the following four input signals; (1) the output of SEL 552, (2) the output of SEL 576, (3) the output of SEL 602 and (4) the output of SEL 626. PRI 570 is coupled to the select lines of SEL 566. PRI 570 determines which of the four signals has priority. The input of PRI 570 is coupled to compare 568. Compare 568 samples and compares certain control bits from the following four signals; (1) the output of SEL 552, (2) the output of SEL 576, (3) the output of SEL 602 and (4) the output of SEL 626. Compare 568 then provides the result to PRI 570.

FIG. 17C is a functional diagram of the Port-1 (P1) decode circuitry within a HUB element. I/F block 572 is coupled to RAM 574, SEL 576, and PARCHK 580. I/F 572 provides the input signal from the P1 port to the HUB circuitry. RAM 574 stores the packets that are received through the P1 interface 572. PARCHK 580 performs a parity check on in-coming data from I/F 572 and if an error is detected, PARERR 582 issues a parity error. SEL 576 is coupled to RAM 574, I/F 572, and CTRL 578. SEL 576 either selects a request from RAM 574 or directly from I/F 572 depending on the value received from CTRL 578. CTRL 578 determines which request to select based on the values of the signals SEL 532 output, SEL 552 output, SEL 602 output and SEL 626 output. The output of SEL 576 is also coupled to checksum detector 584, even/odd detector 586 and stuck-extend detector 588. The checksum detector 584 contains a register which is initially loaded with the second header of the request. The first data word is XOR'd with this checksum register and the result is placed in the checksum register. This operation continues until the EXTEND line goes inactive. Once the EXTEND line goes inactive, the HUB receives a checksum word and this word is compared with the contents of the checksum register. If the checksum word and the checksum register do not compare, then the "checksum error" flag is set. The even/odd detector 586 checks to insure that the EXTEND line was active for an even number of cycles. If not, an error flag is set. Stuck extend detector 588 determines if the EXTEND line has been stuck in the active mode for greater than 94 cycles. If it has, an error flag is set. SEL 590 selects one of four signals to be placed on the P1 interface. SEL 590 is coupled to I/F 592 and further coupled to the following four input signals; (1) the output of SEL 532, (2) the output of SEL 552, (3) the output of SEL 602 and (4) the output of SEL 626. PRI 596 is coupled to the select lines of SEL 590. PRI 596 determines which of the four signals has priority. The input of PRI 596 is coupled to compare 594. Compare 594 samples and compares certain control bits from the following four signals; (1) the output of SEL 532, (2) the output of SEL 552, (3) the output of SEL 602 and (4) the output of SEL 626. Compare 594 then provides the result to PRI 596.

Figure 17D:
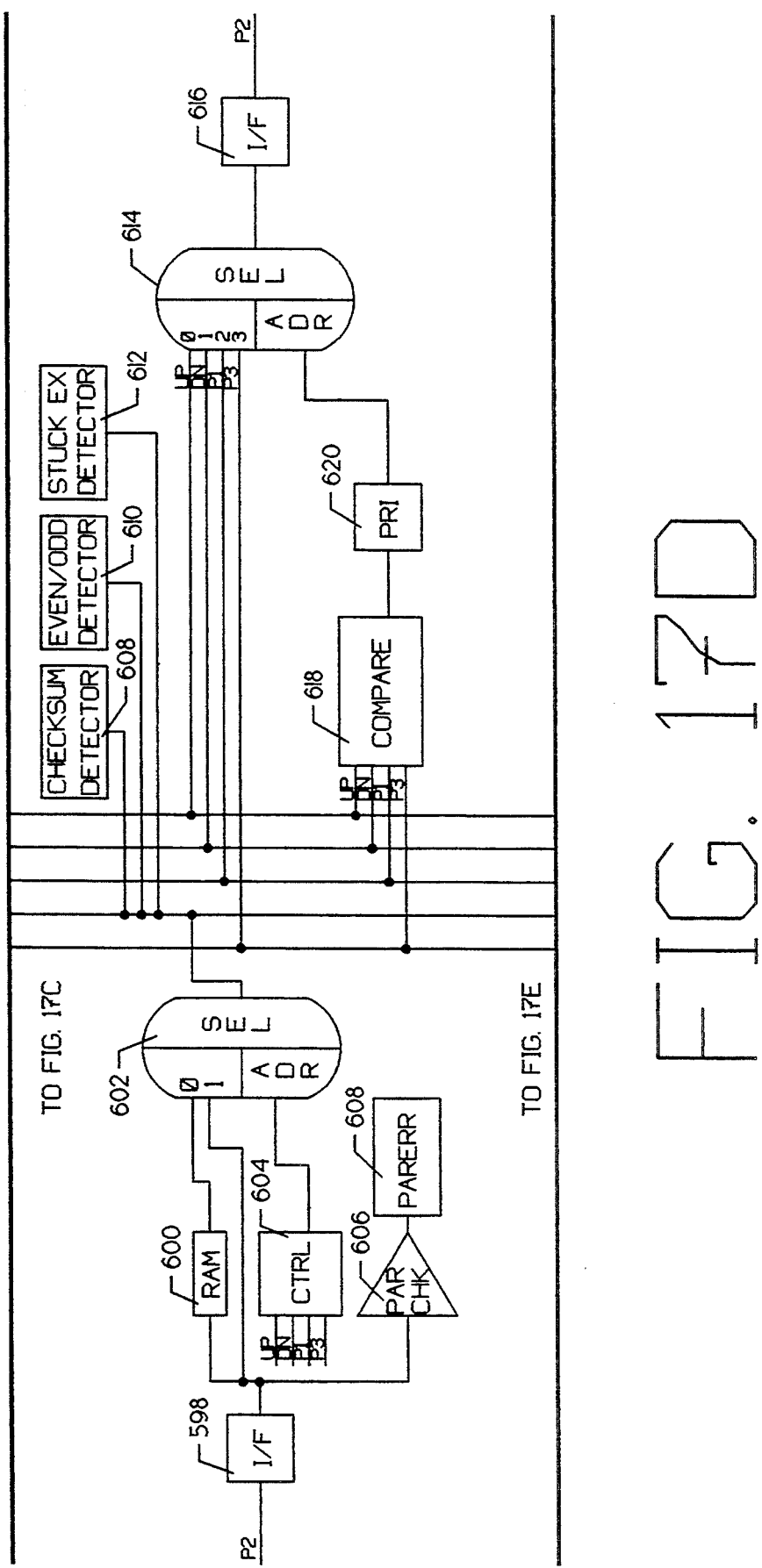
FIG. 17D is a fourth functional block diagram showing a fourth portion of the HUB element as shown in FIG. 17.

FIG. 17D is a functional diagram of the Port-2 (P2) decode circuitry within a HUB element. I/F block 598 is coupled to RAM 600, SEL 602, and PARCHK 606. I/F 598 provides the input signal from the P2 interface to the HUB circuitry. RAM 600 stores the packets that are received through the P2 interface 598. PARCHK 606 performs a parity check on in-coming data from I/F 598 and if an error is detected PARERR 608 issues a parity error. SEL 602 is coupled to RAM 600, I/F 598, and CTRL 604. SEL 602 either selects a request from RAM 600 or directly from I/F 598 depending on the value received from CTRL 604. CTRL 604 determines which request to select based on the values of the signals SEL 532 output, SEL 552 output, SEL 576 output and SEL 626 output. The output of SEL 602 is also coupled to checksum detector 608, even/odd detector 610 and stuck-extend detector 612. The checksum detector 608 contains a register which is initially loaded with the second header of the request. The first data word is XOR'd with this checksum register and the result is placed in the checksum register. This operation continues until the extend line goes inactive. Once the EXTEND line goes inactive, the HUB receives a checksum word and this word is compared with the contents of the checksum register. If the checksum word and the checksum register do not compare, then the checksum error flag is set. The even/odd detector 610 checks to insure that the EXTEND line was active for an even number of cycles. If not, an error flag is set. Stuck extend detector 612 determines if the EXTEND line has been stuck in the active mode for greater than 94 cycles. If it has, an error flag is set. SEL 614 selects one of four signals to be placed on the P2 interface. SEL 614 is coupled to I/F 616 and further coupled to the following four input signals; (1) the output of SEL 532, (2) the output of SEL 552, (3) the output of SEL 576 and (4) the output of SEL 626. PRI 620 is coupled to the select lines of SEL 614. PRI 620 determines which of the four signals has priority. The input of PRI 620 is coupled to compare 618. Compare 618 samples and compares certain control bits from the following four signals; (1) the output of SEL 532, (2) the output of SEL 552, (3) the output of SEL 576 and (4) the output of SEL 626. Compare 618 then provides the result to PRI 620.

Figure 17E:
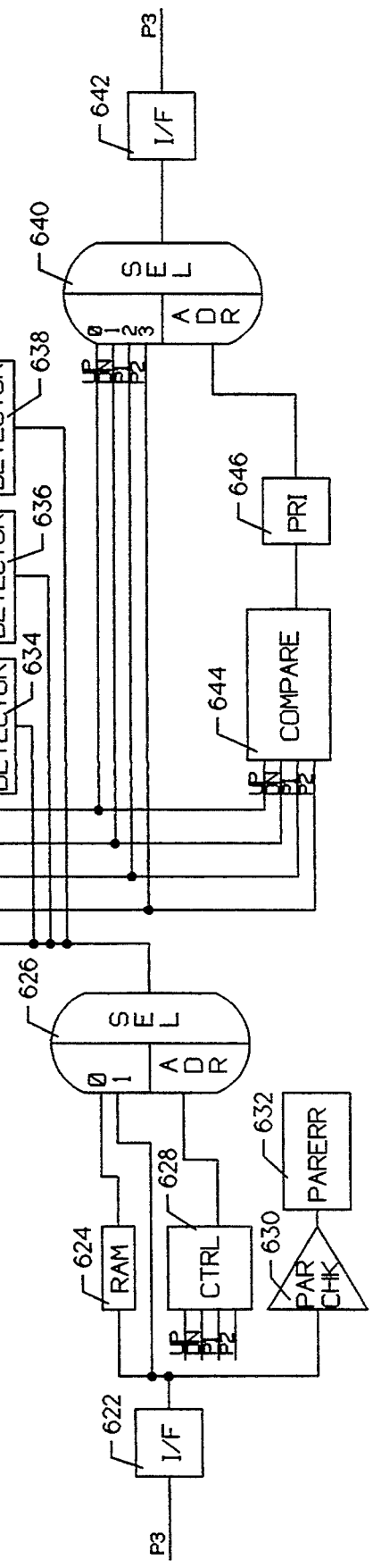
FIG. 17E is a fifth functional block diagram showing a fifth portion of the HUB element as shown in FIG. 17.

FIG. 17E is a functional diagram of the Port-3 (P3) decode circuitry within a HUB element. I/F block 622 is coupled to RAM 624, SEL 626, and PARCHK 630. I/F 622 provides the input signal from the P3 interface to the HUB circuitry. RAM 624 stores the packets that are received through the P3 interface 622. PARCHK 630 performs a parity check on in-coming data from I/F 622 and if an error is detected, PARERR 632 issues a parity error. SEL 626 is coupled to RAM 624, I/F 622, and CTRL 28. SEL 626 either selects a request from RAM 624 or directly from I/F 522 depending on the value received from CTRL 628. CTRL 628 determines which request to select based on the values of the signals SEL 532 output, SEL 552 output, SEL 576 output and SEL 602 output. The output of SEL 626 is also coupled to checksum detector 634, even/odd detector 636 and stuck-extend detector 638. The checksum detector 634 contains a register which is initially loaded with the second header of the request. The first data word is XOR'd with this checksum register and the result is placed in the checksum register. This operation continues until the EXTEND line goes inactive. Once the EXTEND line goes inactive, the HUB receives a checksum word and this word is compared with the contents of the checksum register. If the checksum word and the checksum register do not compare, then the "checksum error" flag is set. The even/odd detector 636 checks to insure that the EXTEND line was active for an even number of cycles. If not, an error flag is set. Stuck extend detector 638 determines if the EXTEND line has been stuck in the active mode for greater than 94 cycles. If it has, an error flag is set. SEL 640 selects one of four signals to be placed on the P3 interface. SEL 640 is coupled to I/F 642 and further coupled to the following four input signals; (1) the output of SEL 532, (2) the output of SEL 552, (3) the output of SEL 576 and (4) the output of SEL 602. PRI 646 is coupled to the select lines of SEL 640. PRI 646 determines which of the four signals has priority. The input of PRI 646 is coupled to compare 644. Compare 644 samples and compares certain control bits from the following four signals; (1) the output of SEL 532, (2) the output of SEL 552, (3) the output of SEL 576 and (4) the output of SEL 602. Compare 644 then provides the result to PRI 646.

By reviewing FIG. 17A-E together, the reader will recognize that the preferred mode of the HUB element contains undefined paths. Not every extend input to a HUB has an extend output. In theory, there could exist a logical path from every input to every output. However, the preferred embodiment of the HUB has placed restrictions on certain paths and therefore the HUB design does not provided logic for these cases. For all HUB0's the following paths do not exist: (1) any requester to itself; and (2) any requester on the up-street attempting to go on a down street or vice versa. For all HUB1's the following paths do not exist: (1) any requester to itself; (2) a requester from HUB0 via the internal interface attempting to go on either an up or down street on HUB1; and (3) a nonvolatile memory request to another port on the nonvolatile memory via the cross-over path.

Although there are some undefined paths in the preferred embodiment of the HUB design, the present invention should not be limited to the description of the preferred embodiment but should include logical paths from every input to every output.

Having thus described the preferred embodiments of the present invention, those of skill in the art will readily appreciate that yet other embodiments may be made and used within the scope of the claims hereto attached.

I claim:

1. A method for detecting and rerouting around hardware faults within a computer architecture comprising;
   a. Evaluating an input request to a HUB element having a plurality of input ports and a plurality of output ports and selecting which of the plurality of output ports is to be accessed;
   b. measuring a value on a LINE AVAIL line which corresponds to said output port which was selected in step (a);
   c. sending said input request out the selected output port if said corresponding LINE AVAIL line was determined to be active;
   d. selecting one of said plurality of output ports which has a corresponding active LINE AVAIL line in a predetermined manner, if step (c) determines that said LINE AVAIL line which corresponds to the output port which was selected in step (a) was determined to be inactive;
   e. sending said input request out of one of said plurality of output ports which was selected in (d);
   f. waiting for a predetermined period of time for an Acknowledge signal to be returned by a receiving device thereby indicating that there are no hardware faults within said receiving device;
   g. sending the remainder of said input request data if said Acknowledge is returned within said predetermined time period; and
   h. executing steps (d)-(f) if said Acknowledge is not returned within said predetermined time period.

2. An apparatus for coupling a plurality of computer interfaces to a plurality of supporting device interfaces comprising;
   a. a plurality of HUB elements for processing and directing a plurality of input signals from said plurality of computer interfaces to said plurality of supporting device interfaces;
   b. a plurality of street elements for coupling said plurality of HUB elements together and further coupling said plurality of computer interfaces and said plurality of supporting device interfaces to said plurality of HUB elements in a predetermined manner;
   c. a plurality of detecting means located within said plurality of HUB elements for detecting a plurality of predetermined types of hardware faults that exist on any of said plurality of street elements; and
   d. an automatic routing means for automatically routing said plurality of input signals from said plurality of computer interfaces to said plurality of supporting device interfaces such that said detected hardware faults are avoided.

3. An apparatus according to claim 2 where said detecting means further comprises a means for detecting a plurality of predetermined types of hardware faults that exist in any of said plurality of HUB elements.

4. An apparatus according to claim 2 where said detecting means further comprises;
   a. a plurality of LINE AVAIL lines coupling said plurality of HUB elements together and further coupling said plurality of computer interfaces and said plurality of supporting device interfaces to said plurality of HUB elements in a predetermined manner;
   b. means within each of said plurality of HUB elements each having a plurality of input ports and a plurality of output ports for determining when one of said plurality of LINE AVAIL lines being connected to said HUB element goes inactive and a further means for determining which output port of said HUB element corresponds to said inactive LINE AVAIL line;
   c. means for disabling one of a plurality of output ports of said HUB element where said disabled output port corresponds to said inactive LINE AVAIL line; and
   d. means for rerouting data intended for said disabled output port of said HUB element to another of said plurality of HUB output ports.

5. An apparatus according to claim 2 where said detecting means further comprises;
   a. a plurality of Acknowledge lines coupling said plurality of HUB elements together and further coupling said plurality of computer interfaces and said plurality of supporting device interfaces to said plurality of HUB elements in a predetermined manner;
   b. means within each of said plurality of HUB elements each having a plurality of input ports and a plurality of output ports for determining when one of said plurality of Acknowledge lines being connected to said HUB element does not respond within a predetermined time period and a further means for determining which output port of said HUB element corresponds to said timed-out Acknowledge line;

c. means for disabling one of a plurality of output ports of said HUB element where said disabled output port corresponds to said timed-out Acknowledge line; and d. means for rerouting data intended for said disabled output port of said HUB element to another of said plurality of HUB output ports.

6. A method of detecting and rerouting around hardware faults within a computer architecture comprising;

a. evaluating an input request to a HUB element having a plurality of input ports and a plurality of output ports and selecting which of the plurality of output ports is to be accessed;

b. measuring a value on a AVAILABLE line which corresponds to said output port which was selected in step (a);

c. sending said input request out the selected output port if said corresponding AVAILABLE line was determined to be active;

d. selecting one of said plurality of output ports which has a corresponding active AVAILABLE line in a predetermined manner, if step (c) determines that said AVAILABLE line which corresponds to the output port which was selected in step (a) was determined to be inactive;

e. sending said input request out of one of said plurality of output ports which was selected in step (d);

f. waiting for a predetermined period of time for an acknowledge signal to be returned by a receiving device thereby indicating that there are no hardware faults within said receiving device;

g. sending the remainder of said input request data if said acknowledge is returned within said predetermined time period; and h. executing steps (d)–(g) if said acknowledge is not returned within said predetermined time period.

* * * * *